(12) United States Patent
Yoneda

(10) Patent No.: US 9,775,247 B2
(45) Date of Patent: Sep. 26, 2017

(54) CHIP RESISTOR AND ELECTRONIC DEVICE

(71) Applicant: ROHM CO., LTD., Kyoto-shi, Kyoto (JP)

(72) Inventor: Masaki Yoneda, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/340,634

(22) Filed: Nov. 1, 2016

(65) Prior Publication Data

US 2017/0048983 A1    Feb. 16, 2017

Related U.S. Application Data

(63) Continuation of application No. 14/366,092, filed as application No. PCT/JP2012/081928 on Dec. 10, 2012, now Pat. No. 9,508,473.

(30) Foreign Application Priority Data

Dec. 26, 2011 (JP) .................................. 2011-283599
Nov. 19, 2012 (JP) .................................. 2012-253029

(51) Int. Cl.
*H01C 1/012* (2006.01)
*H05K 1/18* (2006.01)
(Continued)

(52) U.S. Cl.
CPC .............. *H05K 1/185* (2013.01); *H01C 1/012* (2013.01); *H01C 1/142* (2013.01); *H01C 7/003* (2013.01);
(Continued)

(58) Field of Classification Search
CPC ........ H01C 1/012; H01C 1/142; H01C 1/148; H01C 10/00; H01C 3/00; H01C 7/00; H01C 13/00
(Continued)

(56) References Cited

U.S. PATENT DOCUMENTS 6,304,167 B1    10/2001   Nakayama
6,356,184 B1    3/2002    Doi
(Continued)

FOREIGN PATENT DOCUMENTS

| JP | 2007-173574 A | 7/2007 |
| JP | 2001-126901 A | 5/2011 |
| JP | 2011-165752   | 8/2011 |
| JP | 2011-199188   | 10/2011 |

OTHER PUBLICATIONS

English translation for JP 2011-165752, Hayahsi et al., Aug. 2011.
(Continued)

*Primary Examiner* — Kyung Lee
(74) *Attorney, Agent, or Firm* — Hamre, Schumann, Mueller & Larson, P.C.

(57) ABSTRACT

[Object] To provide a chip resistor with which laser irradiation requires no extremely high positional accuracy, and a plating layer provided on a base and adjacent to a resistor element can be connected to an external conductive layer. [Solution] A chip resistor includes a base 1, a first principal surface electrode 21, a second principal surface electrode spaced apart from the first principal surface electrode 21 in a first direction X1, a resistor element 4 in contact with the first principal surface electrode 21 and the second principal surface electrode 31, an overcoat 6 covering the resistor element 4, the first principal surface electrode 21 and the second principal surface electrode, a first auxiliary electrode 25 covering the first principal surface electrode 21 and the overcoat 6, and a first plating electrode 27 covering the first auxiliary electrode 25. The first auxiliary electrode 25 includes a portion 259 offset from the first principal surface electrode 21 in the first direction X1.

20 Claims, 24 Drawing Sheets

(51) Int. Cl.
*H01C 1/142* (2006.01)
*H01C 7/00* (2006.01)
*H01C 17/02* (2006.01)
*H01C 17/28* (2006.01)
*H01C 17/00* (2006.01)
*H05K 1/11* (2006.01)

(52) U.S. Cl.
CPC ........... *H01C 17/006* (2013.01); *H01C 17/02* (2013.01); *H01C 17/281* (2013.01); *H05K 1/113* (2013.01); *H05K 2201/10022* (2013.01)

(58) Field of Classification Search
USPC .................. 339/309, 313, 314, 327, 332
See application file for complete search history.

(56) References Cited

U.S. PATENT DOCUMENTS

| | | |
|---|---|---|
| 6,492,896 B2 | 12/2002 | Yoneda |
| 6,859,133 B2 | 2/2005 | Nakanishi |
| 6,861,941 B2 | 3/2005 | Kuriyama |
| 8,179,226 B2 | 5/2012 | Ryu |
| 8,193,899 B2 | 6/2012 | Takeuchi |
| 2003/0156008 A1 | 8/2003 | Nakanishi |

OTHER PUBLICATIONS

English translation for JP 2011-199188, Yogo, Oct. 2011.
Office Action issued in the corresponding Japanese Patent application, dated Jun. 20, 2017 (3 pages), and corresponding English translation.

CHIP RESISTOR AND ELECTRONIC DEVICE

TECHNICAL FIELD

The present invention relates a chip resistor and an electronic device.

BACKGROUND ART

Chip resistors are conventionally known (see e.g. Patent Document 1). The chip resistor disclosed in this document includes an insulating substrate, a resistor element, a protective film and a plating. The resistor element is formed on the upper surface of the insulating substrate. The protective film is formed on the upper surface of the insulating substrate. The protective film covers the resistor element. The plating is electrically connected to the resistor element. The plating has a portion formed on the upper surface of the insulating substrate and another portion formed on the lower surface of the insulating substrate. The portion of the plating formed on the upper surface of the insulating substrate is referred to below as the upper plating portion, and the portion of the plating formed on the lower surface of the insulating substrate is referred to below as the lower plating portion.

In mounting the conventional chip resistor, the lower plating portion is connected to an external conductor outside of the chip resistor. The external conductor is formed on the inner surface of a via hole provided in an insulating resin layer. Such a via hole is formed by applying a laser beam to the insulating resin layer.

PRIOR ART REFERENCE

Patent Document

Patent Document 1: JP-A-2011-199188

SUMMARY OF THE INVENTION

Problems to be Solved by the Invention

It is desired, on a certain occasion, to use the upper plating portion for connection to the external conductor provided separately from the chip resistor. However, it is very difficult to apply a laser beam precisely to a region of the insulating resin layer corresponding to the upper plating portion. With the conventional chip resistor, laser beam application to the region corresponding to the upper plating portion requires extremely high positional accuracy.

The present invention has been proposed in view of the foregoing situation. It is therefore an object of the present invention to provide a chip resistor configured to enable connection of the plating layer adjacent to the resistor element to an external conductive layer without the need for applying a laser beam with extremely high positional accuracy.

Means for Solving the Problem

According to a first aspect of the present invention, there is provided a chip resistor comprising a base including a principal surface, a first principal surface electrode formed on the principal surface, a second principal surface electrode formed on the principal surface and spaced apart from the first principal surface electrode in a first direction, a resistor element formed on the principal surface in contact with the first principal surface electrode and the second principal surface electrode, an overcoat covering the resistor element, the first principal surface electrode and the second principal surface electrode, a first auxiliary electrode covering the first principal surface electrode and the overcoat, and a first plating electrode covering the first auxiliary electrode. The first auxiliary electrode includes a portion offset from the first principal surface electrode in the first direction.

Preferably, the first plating electrode includes a portion offset from the overcoat in a direction in which the principal surface faces.

Preferably, the first auxiliary electrode includes an auxiliary electrode obverse surface covered by the first plating electrode and held in contact with the overcoat. The overcoat includes an overcoat obverse surface facing in the same direction as the principal surface. The auxiliary electrode obverse surface is flush with the overcoat obverse surface or offset from the overcoat obverse surface toward the principal surface.

Preferably, the portion of the auxiliary electrode obverse surface which is offset from the first principal surface electrode in the first direction has a height difference of 0-10 µm with respect to the highest point of the overcoat obverse surface in the direction in which the principal surface faces.

Preferably, the portion of the auxiliary electrode obverse surface which is offset from the first principal surface electrode in the first direction has a height difference of 0-6 µm with respect to the highest point of the overcoat obverse surface in the direction in which the principal surface faces.

Preferably, the chip resistor further comprises a second auxiliary electrode covering the second principal surface electrode and the overcoat, and a second plating electrode covering the second auxiliary electrode. The second auxiliary electrode includes a portion offset from the second principal surface electrode in a second direction opposite from the first direction.

Preferably, the base includes a reverse surface facing away from the principal surface. The chip resistor further comprises a first reverse surface electrode formed on the reverse surface and covered by the first plating electrode, and a second reverse surface electrode formed on the reverse surface and covered by the second plating electrode.

Preferably, the first plating electrode includes a principal surface layer adjacent to the principal surface. The principal surface layer includes a portion offset from the first reverse surface electrode in the first direction.

Preferably, the principal surface layer is 200-260 µm in dimension in the first direction.

Preferably, the first plating electrode includes a reverse surface layer adjacent to the reverse surface. The reverse surface layer includes a portion offset from the first auxiliary electrode in the first direction.

Preferably, the reverse surface layer is 200-260 µm in dimension in the first direction.

Preferably, the base includes a side surface facing in a second direction opposite from the first direction. The chip resistor further comprises a side surface electrode covering the side surface. The first plating electrode covers the side surface electrode.

Preferably, the side surface electrode is formed by sputtering.

Preferably, the first plating electrode is made of at least one of Cu, Au, Ni and Sn.

Preferably, the first plating electrode includes a first layer and a second layer, and the first layer includes a portion positioned between the second layer and the first auxiliary electrode.

Preferably, the first layer is made of Ni and the second layer is made of at least one of Cu, Au and Sn.

Preferably, the chip resistor further comprises an undercoat provided between the resistor element and the overcoat.

According to a second aspect of the present invention, there is provided an electronic device comprising a chip resistor provided according to the first aspect of the present invention and a filled-resin board surrounding the chip resistor.

Preferably, the filled-resin board is formed with a via. The filled-resin board further comprises a conductive layer formed on an inner surface defining the via. The conductive layer is in direct contact with the first plating electrode.

Preferably, the conductive layer is in direct contact with a portion of the first plating electrode which is adjacent to the principal surface of the base.

Preferably, the conductive layer is in direct contact with a portion of the first plating electrode which is adjacent to a reverse surface of the base opposite from the principal surface.

Preferably, the conductive layer and the first plating electrode are made of Cu.

MODE FOR CARRYING OUT THE INVENTION

Figure 1:
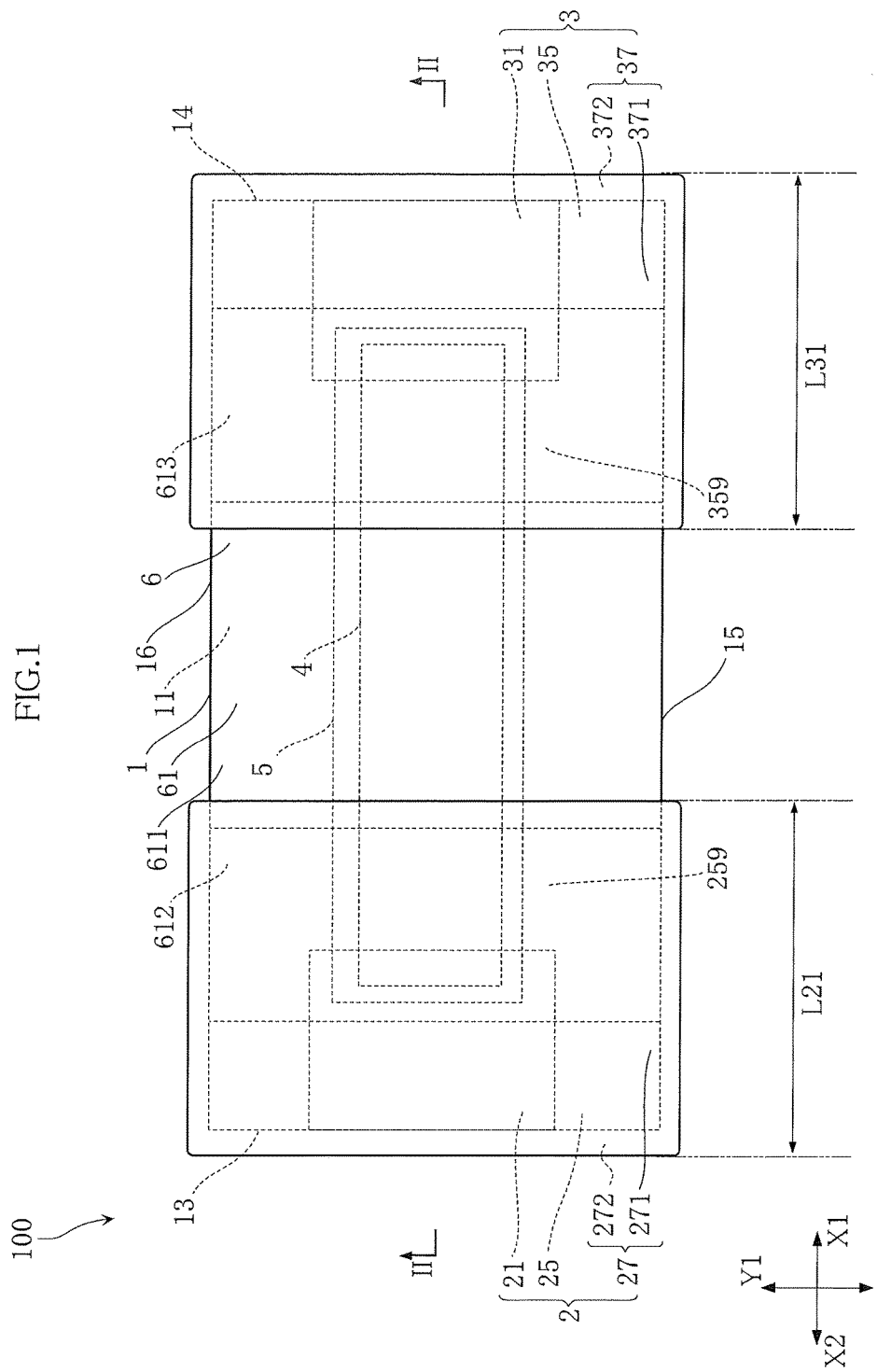
FIG. 1 is a plan view (partially transparent) illustrating a chip resistor according to an embodiment of the present invention.
Figure 2:
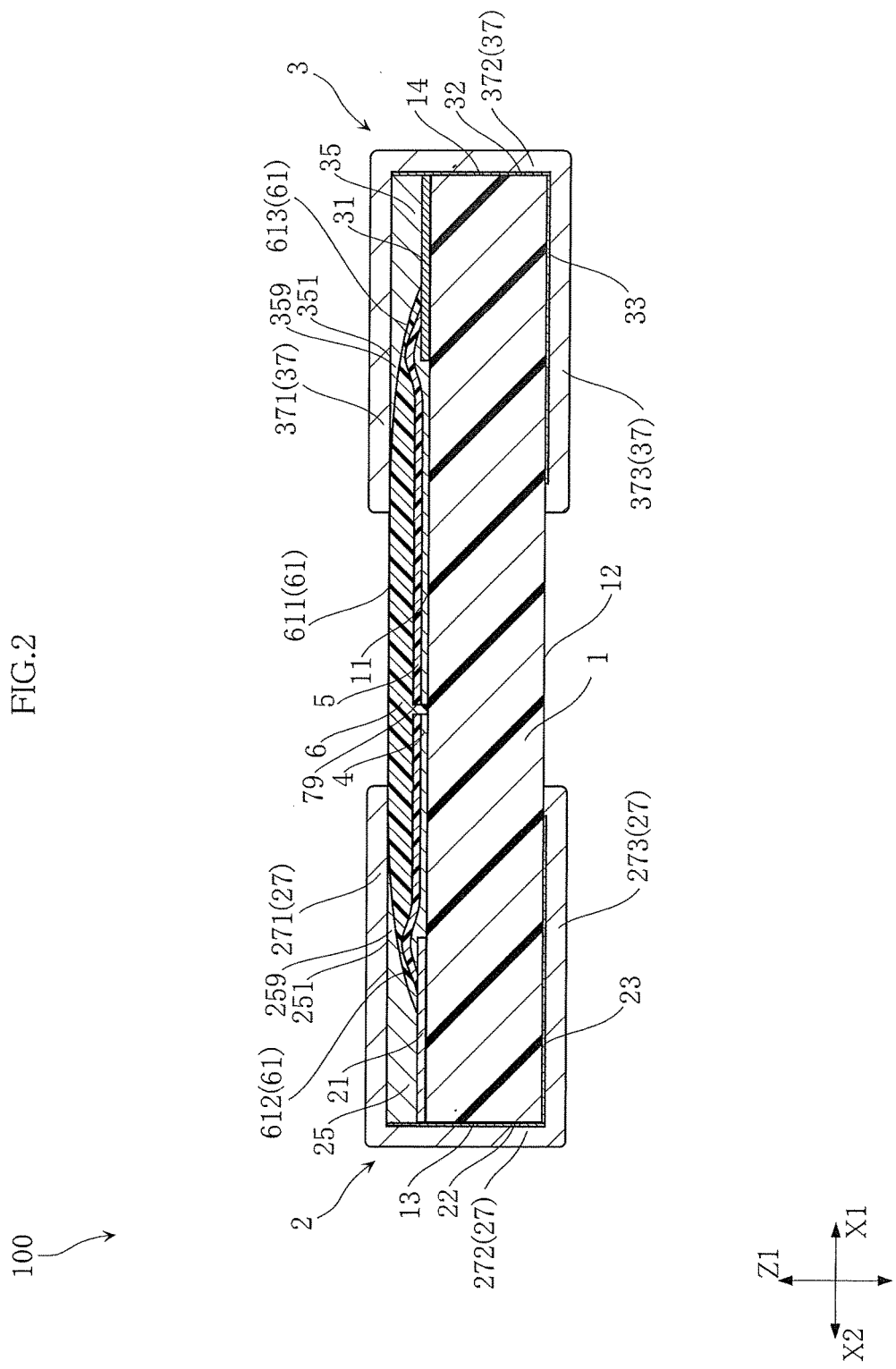
FIG. 2 is a sectional view taken along lines II-II in FIG. 1.

FIG. 1 is a plan view (partially transparent) of a chip resistor according to an embodiment of the present invention. FIG. 2 is a sectional view taken along lines II-II in FIG. 1.

The chip resistor 100 shown in these figures includes a base 1, a first electrode portion 2, a second electrode portion 3, a resistor element 4, an undercoat 5 and an overcoat 6. For instance, the chip resistor 100 is about 570-630 μm in dimension in the horizontal direction in FIG. 1, about 270-330 μm in dimension in the vertical direction in FIG. 1 and not more than 150 μm in dimension in the vertical direction in FIG. 2.

Figure 3:
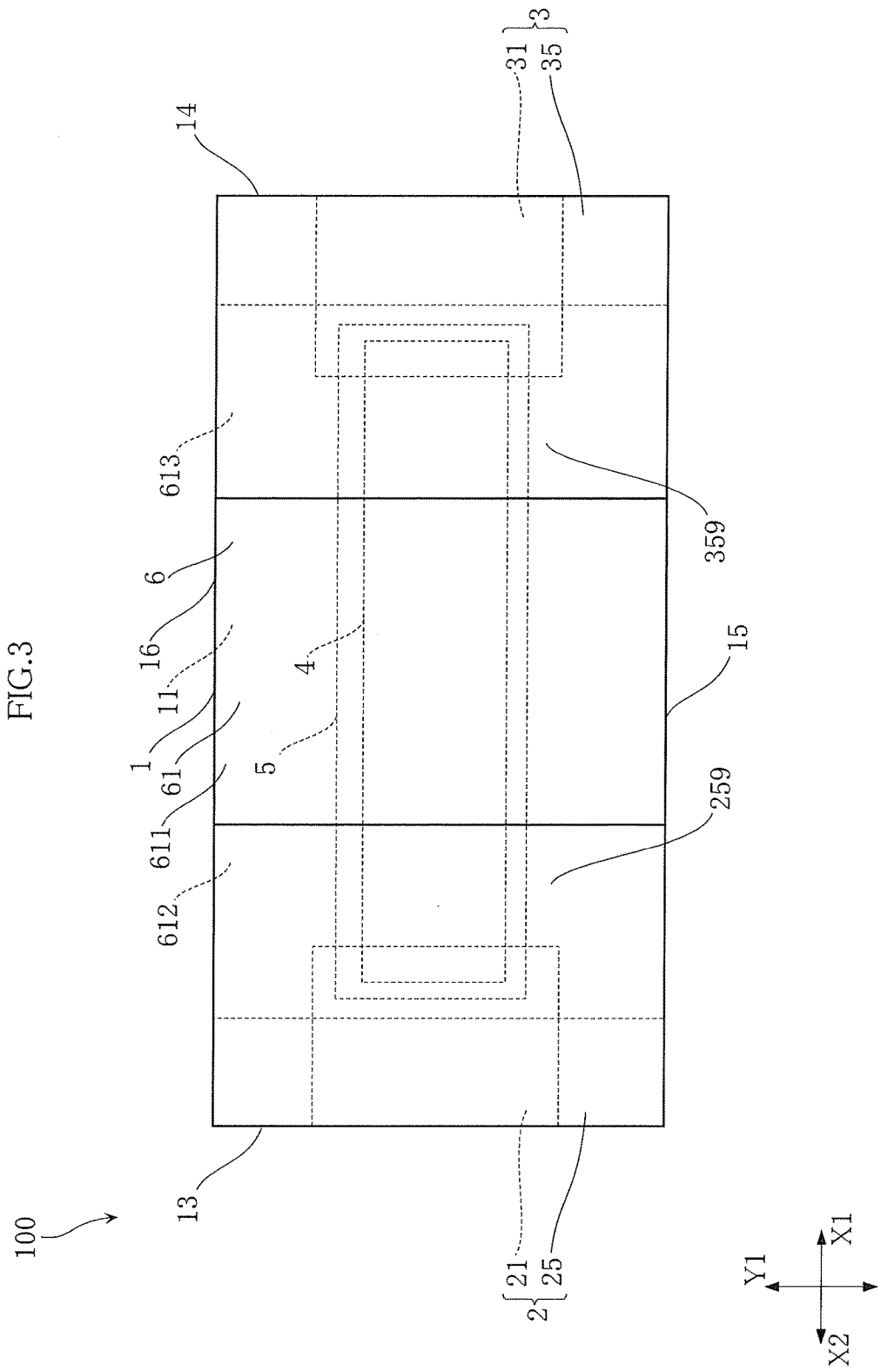
FIG. 3 is a plan view (partially transparent) obtained by omitting a first plating electrode and a second plating electrode from FIG. 1.
Figure 4:
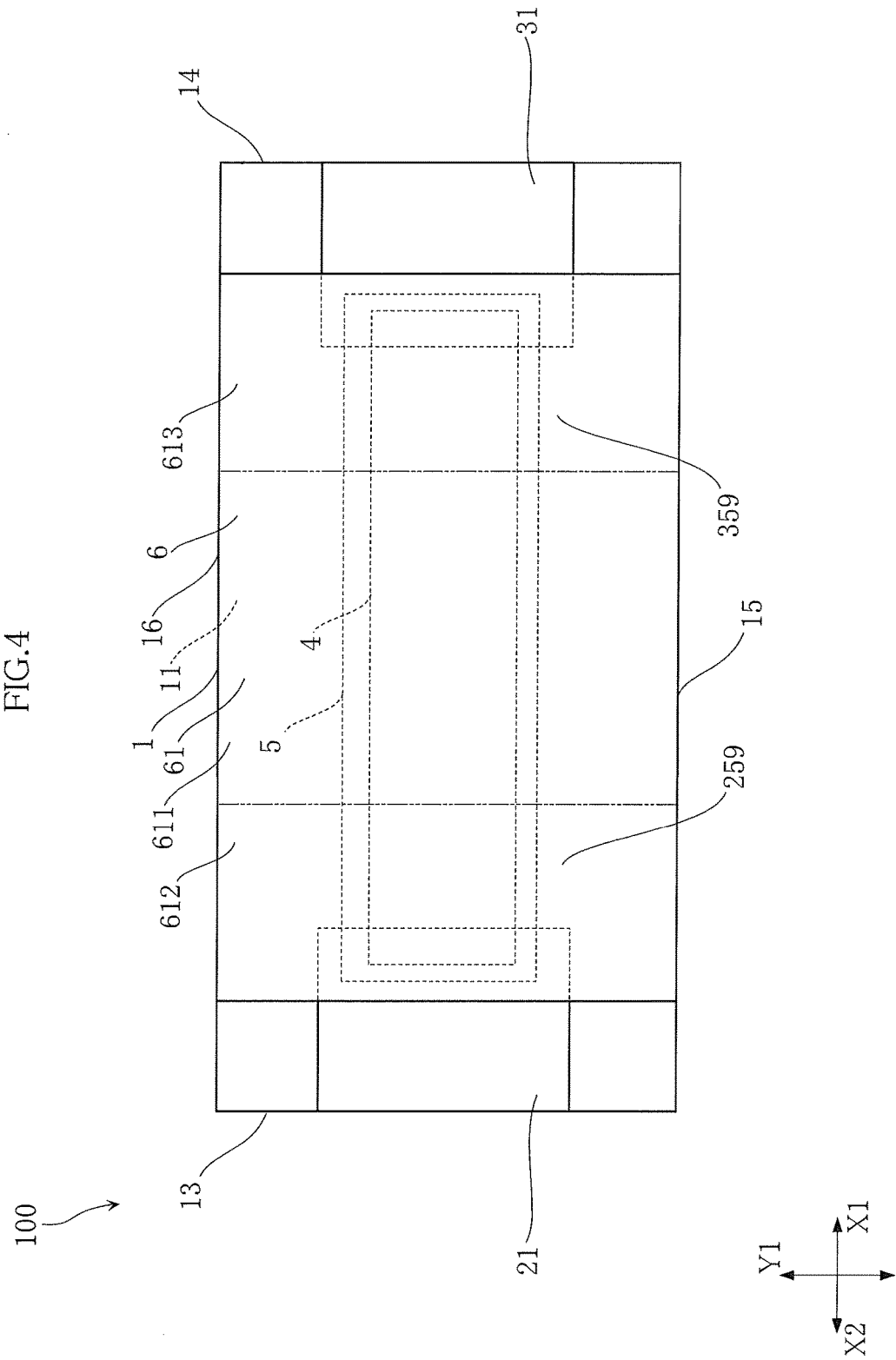
FIG. 4 is a plan view (partially transparent) obtained by omitting a first auxiliary electrode and a second auxiliary electrode from FIG. 3.
Figure 5:
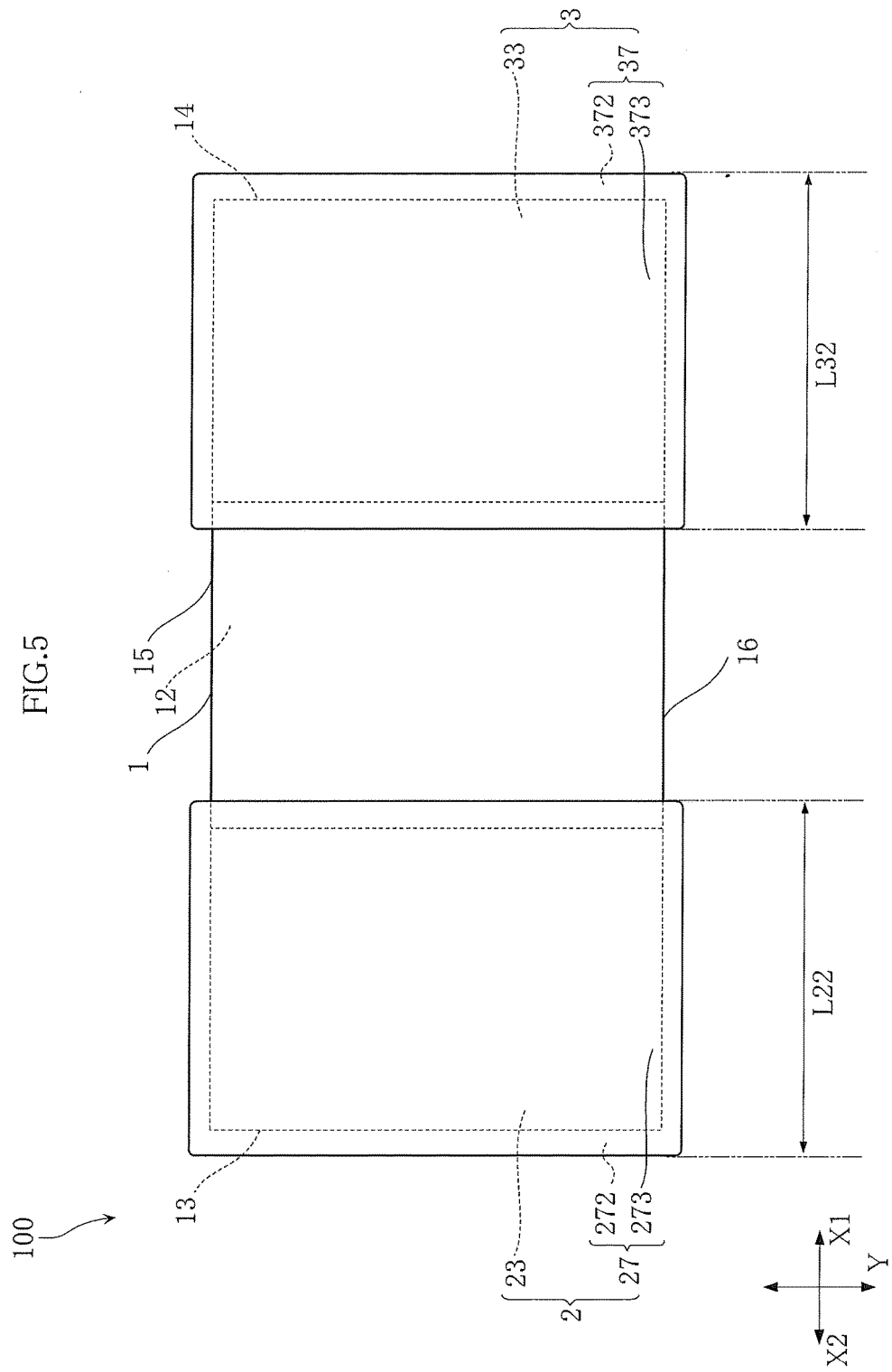
FIG. 5 is a bottom view (partially transparent) of the chip resistor illustrated in FIG. 1.
Figure 6:
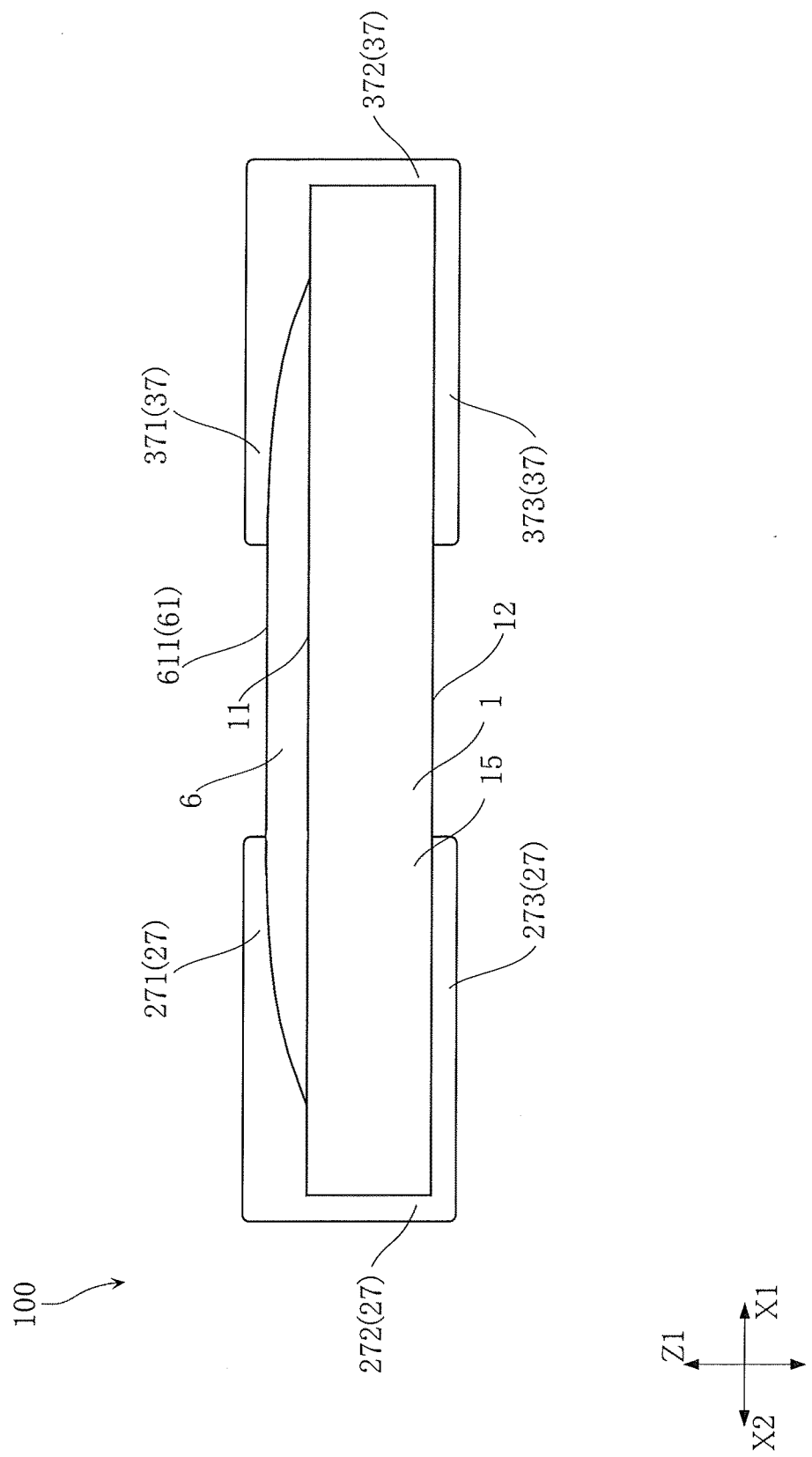
FIG. 6 is a front view of the chip resistor illustrated in FIG. 1.
Figure 7:
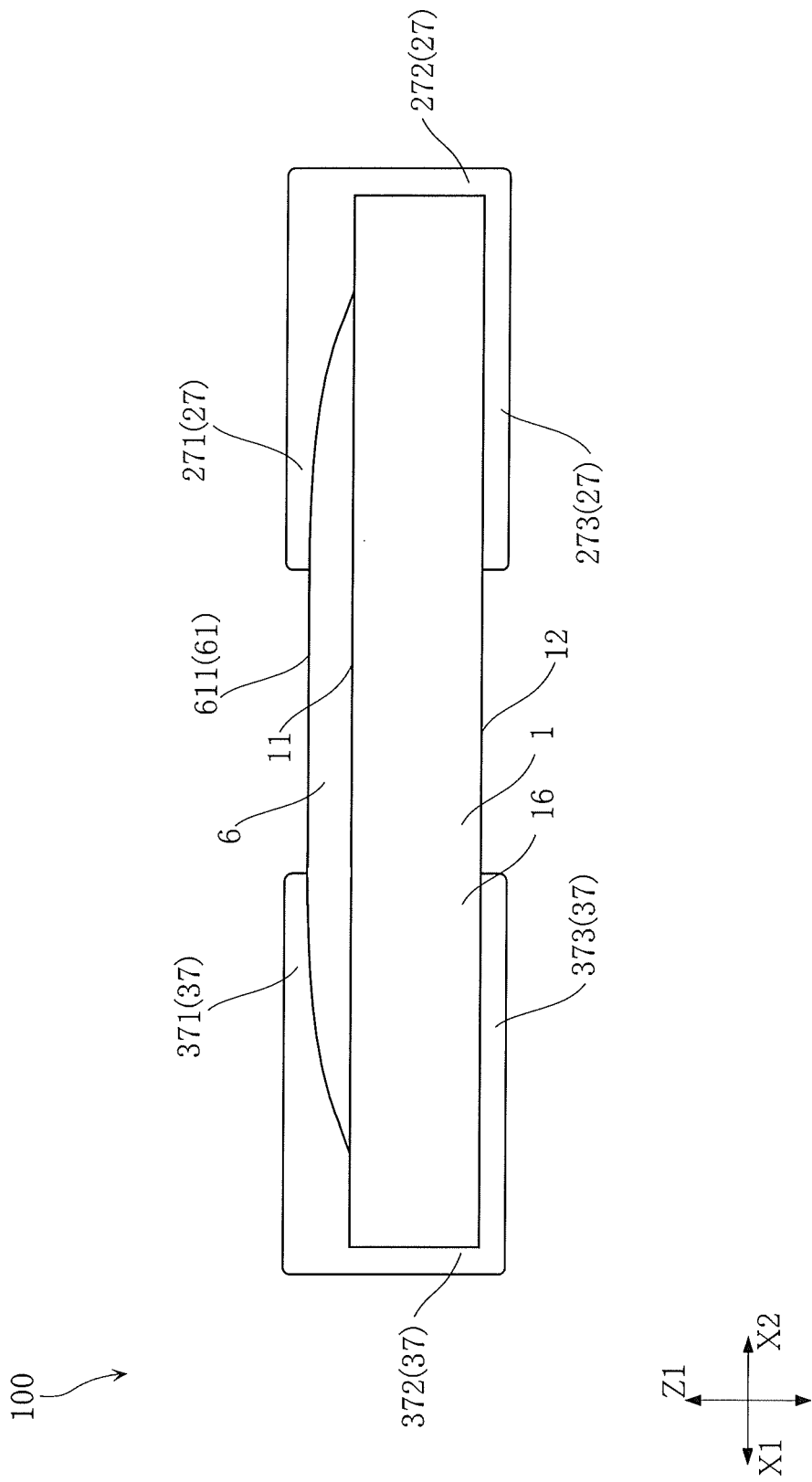
FIG. 7 is a rear view of the chip resistor illustrated in FIG. 1.
Figure 8:
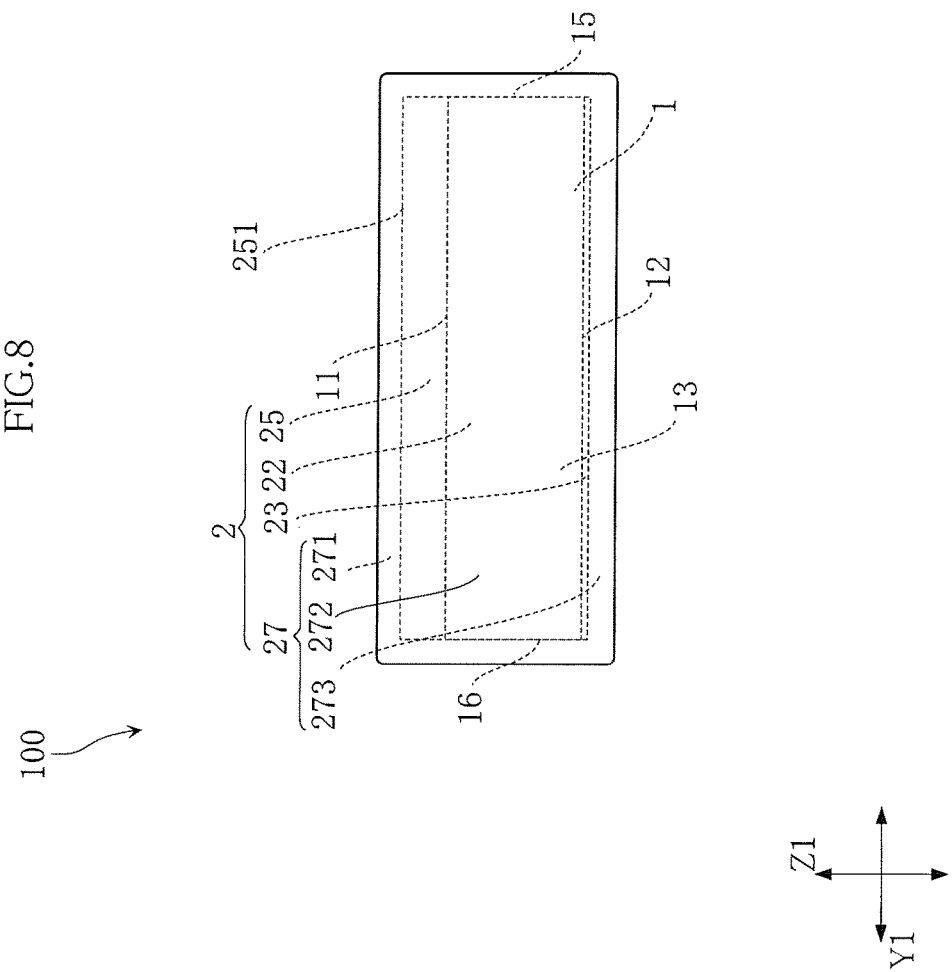
FIG. 8 is a left side view (partially transparent) of the chip resistor illustrated in FIG. 1.
Figure 9:
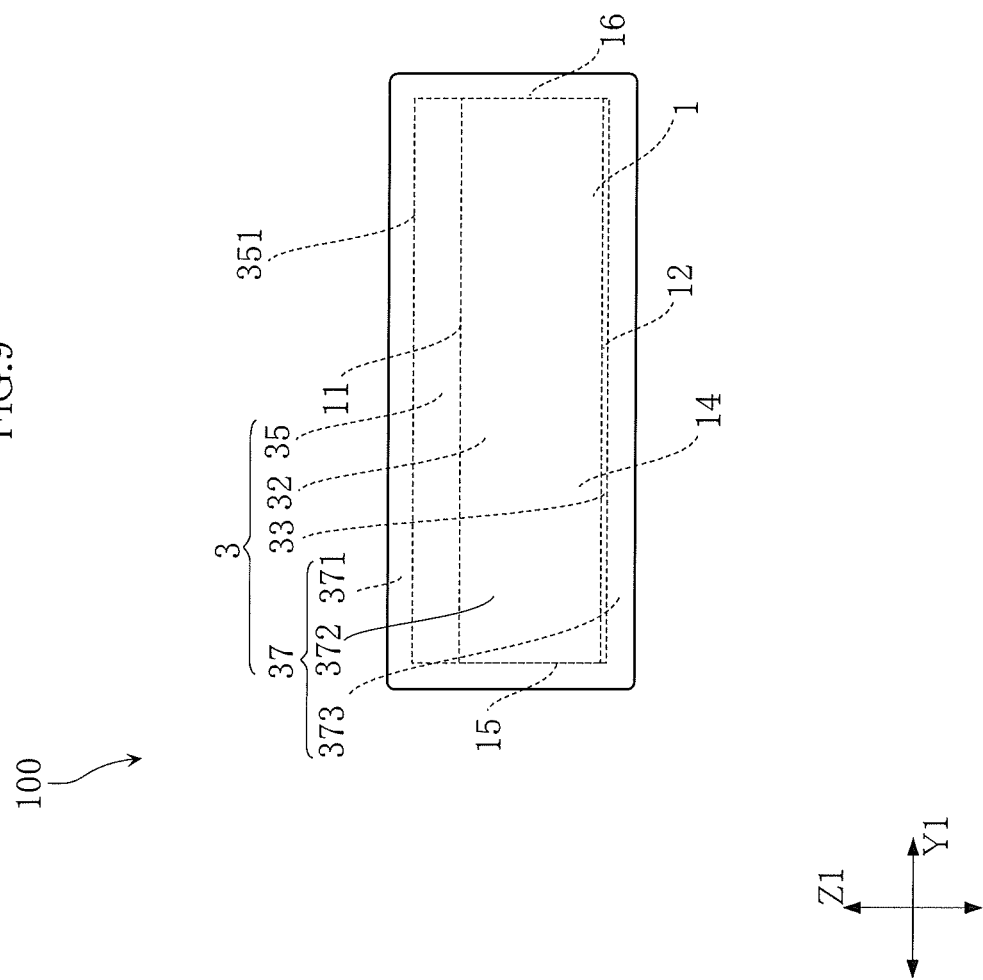
FIG. 9 is right side view (partially transparent) of the chip resistor illustrated in FIG. 1.

FIG. 3 is a plan view (partially transparent) obtained by omitting the first plating electrode and the second plating electrode from FIG. 1. FIG. 4 is a plan view (partially transparent) obtained by omitting a first auxiliary electrode and a second auxiliary electrode from FIG. 3. FIG. 5 is a bottom view (partially transparent) of the chip resistor illustrated in FIG. 1. FIG. 6 is a front view of the chip resistor illustrated in FIG. 1. FIG. 7 is a rear view of the chip resistor illustrated in FIG. 1. FIG. 8 is a left side view (partially transparent) of the chip resistor illustrated in FIG. 1. FIG. 9 is a right side view (partially transparent) of the chip resistor illustrated in FIG. 1.

The base 1 illustrated in FIGS. 1-9 is in the form of a rectangular parallelepiped. The base 1 is made of an insulating material. Examples of such an insulating material include a ceramic material such as alumina. The base 1 has a principal surface 11, a reverse surface 12, a first side surface 13, a second side surface 14, a third side surface 15 and a fourth side surface 16. All of the principal surface 11, the reverse surface 12, the first side surface 13, the second side surface 14, the third side surface 15 and the fourth side surface 16 are flat.

The principal surface 11 and the reverse surface 12 face in the mutually opposite directions. All of the first side surface 13, the second side surface 14, the third side surface 15 and the fourth side surface 16 are connected to the principal surface 11 and the reverse surface 12. The first side surface 13 and the second side surface 14 face in the mutually opposite directions. Specifically, the first side surface 13 faces in the second direction X2, whereas the second side surface 14 faces in the first direction X1. The third side surface 15 and the fourth side surface 16 face in the mutually opposite directions. Specifically, the third side surface 15 faces in the downward direction in FIG. 1, whereas the fourth side surface 16 faces in the upward direction in FIG. 1.

Figure 10:
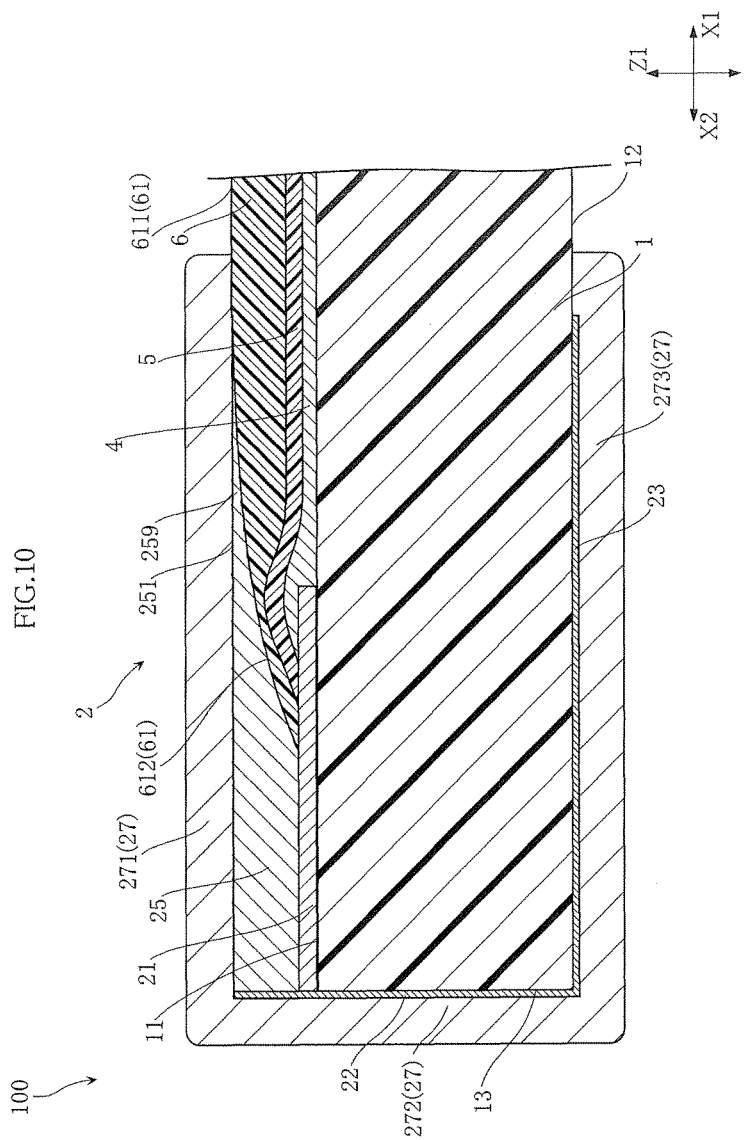
FIG. 10 is a sectional view illustrating a part of the chip resistor of FIG. 2 as enlarged.

FIG. 10 is a sectional view illustrating a part of the chip resistor of FIG. 2 as enlarged.

As shown in FIGS. 1-4 and FIGS. 9 and 10, the first electrode portion 2 includes a first principal surface electrode 21, a first side surface electrode 22, a first reverse surface electrode 23, a first auxiliary electrode 25 and a first plating electrode 27. The first electrode portion 2 is formed on the second direction X2 side of the base 1.

The first principal surface electrode 21 is formed on the principal surface 11 of the base 1. The first principal surface electrode 21 is formed at a region on the second direction X2 side of the principal surface 11. In this embodiment, the first principal surface electrode 21 extends up to the boundary between the principal surface 11 and the first side surface 13. The first principal surface electrode 21 has an end surface that is flush with the first side surface 13. As shown in FIG. 4, in this embodiment, the dimension of the first principal surface electrode 21 in the direction Y1 is smaller than the dimension of the principal surface 11 in the direction Y1. For instance, the first principal surface electrode 21 is made of silver-based metal glaze. In this embodiment, the first principal surface electrode 21 is formed by printing.

Unlike this embodiment, the first principal surface electrode 21 may not extend up to the boundary between the principal surface 11 and the first side surface 13. Unlike this embodiment, the dimension of the first principal surface electrode 21 in the direction Y1 may be equal to the dimension of the principal surface 11 in the direction Y1.

The first side surface electrode 22, which is shown in e.g. FIGS. 8 and 10, is formed on the first side surface 13 of the base 1. In this embodiment, the first side surface electrode 22 covers the entirety of the first side surface 13. Unlike this embodiment, the first side surface electrode 22 may not cover the entirety of the first side surface 13. That is, the first side surface 13 may be exposed from the first side surface electrode 22. Examples of the material forming the first side surface electrode 22 include Ni and Cr. In this embodiment, the first side surface electrode 22 is formed by sputtering. Thus, the thickness of the first side surface electrode 22 is very small. For instance, the thickness of the first side surface electrode 22 formed by sputtering is 100 µm. Unlike this embodiment, the first side surface electrode 22 may be formed by printing. The first side surface electrode 22 is connected to the first principal surface electrode 21. Thus, the first side surface electrode 22 is electrically connected to the first principal surface electrode 21. In this embodiment, the sputter film of the first side surface electrode 22 is not formed on the upper surface of the first principal surface electrode 21.

The first reverse surface electrode 23, which is shown in e.g. FIGS. 5 and 10, is formed on the reverse surface 12 of the base 1. The first reverse surface electrode 23 is formed at a region on the second direction X2 side of the reverse surface 12. The first reverse surface electrode 23 extends up to the boundary between the reverse surface 12 and the first side surface 13. As shown in FIG. 5, the dimension of the first reverse surface electrode 23 in the direction Y1 is equal to the dimension of the reverse surface 12 in the direction Y1. Unlike the example shown in FIG. 5, the dimension of the first reverse surface electrode 23 in the direction Y1 may be smaller than the dimension of the reverse surface 12 in the direction Y1. In this embodiment, examples of the material forming the first reverse surface electrode 23 include Ni and Cr. In this embodiment, the first reverse surface electrode 23 is formed by sputtering. Thus, the thickness of the first reverse surface electrode 23 is very small. For instance, the thickness of the first reverse surface electrode 23 formed by sputtering is 100 µm. The first reverse surface electrode 23 is connected to the first side surface electrode 22. Thus, the first reverse surface electrode 23 is electrically connected to the first side surface electrode 22. Thus, the first reverse surface electrode 23, the first side surface electrode 22 and the first principal surface electrode 21 are electrically connected to each other. Unlike this embodiment, the first reverse surface electrode 23 may be formed by printing (illustrated in FIG. 21 as a variation). In this embodiment, the first side surface electrode 22 and the first reverse surface electrode 23 are directly connected to each other.

The first auxiliary electrode 25 and the first plating electrode 27 are explained after the explanation of the overcoat 6.

Figure 11:
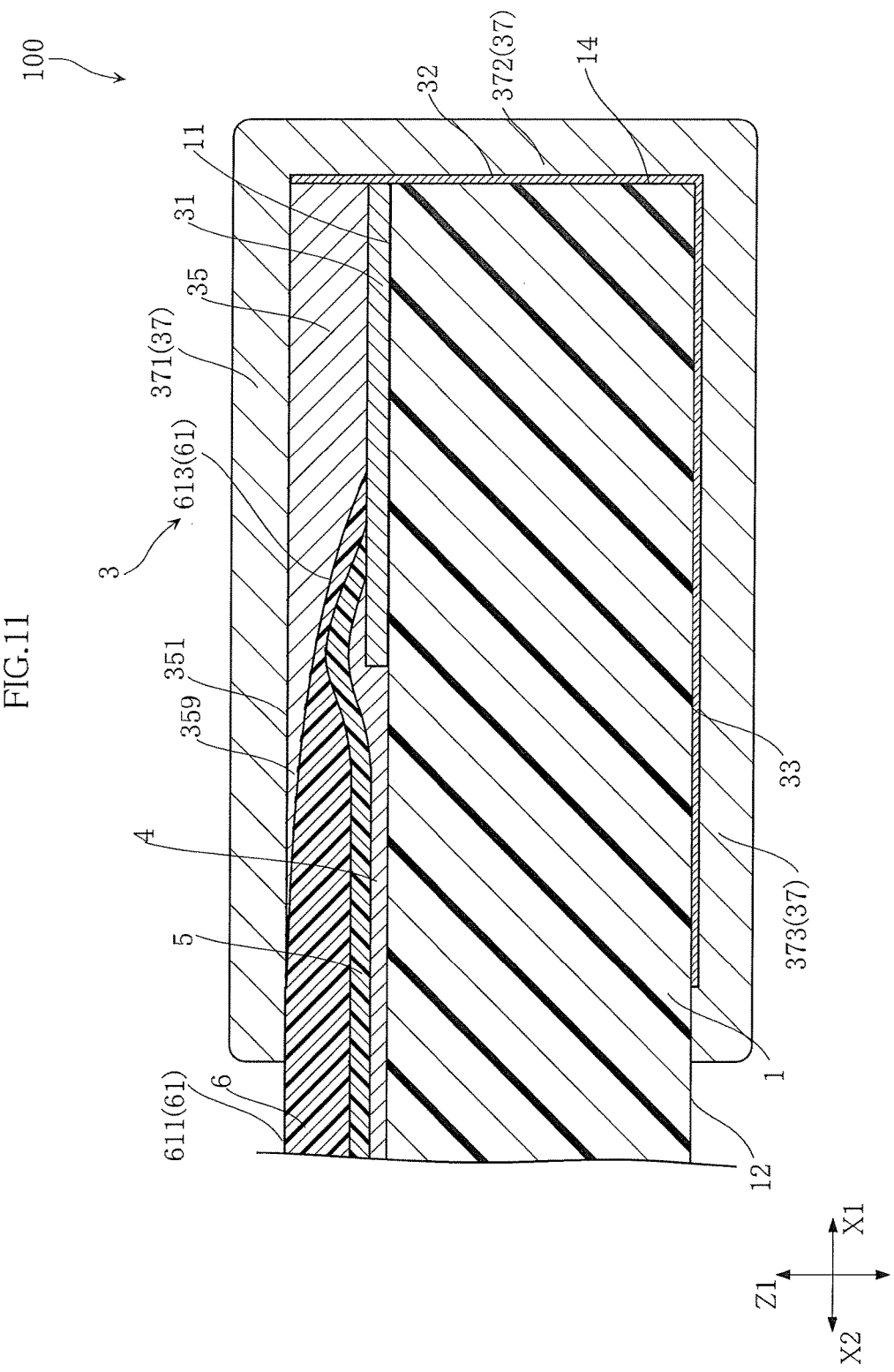
FIG. 11 is a sectional view illustrating a part of the chip resistor of FIG. 2 as enlarged.

FIG. 11 is a sectional view illustrating a part of the chip resistor of FIG. 2 as enlarged.

The second electrode portion 3 includes a second principal surface electrode 31, a second side surface electrode 32, a second reverse surface electrode 33, a second auxiliary electrode 35 and a second plating electrode 37. The second electrode portion 3 is formed on the first direction X1 side of the base 1.

The second principal surface electrode 31 is formed on the principal surface 11 of the base 1. The second principal surface electrode 31 is spaced apart from the first principal surface electrode 21 in the first direction X1. The second principal surface electrode 31 is formed at a region on the first direction X1 side of the principal surface 11. In this embodiment, the second principal surface electrode 31 extends up to the boundary between the principal surface 11 and the second side surface 14. The second principal surface electrode 31 has an end surface that is flush with the second side surface 14. As shown in FIG. 4, in this embodiment, the dimension of the second principal surface electrode 31 in the direction Y1 is smaller than the dimension of the principal surface 11 in the direction Y1. For instance, the second principal surface electrode 321 is made of silver-based metal glaze. In this embodiment, the second principal surface electrode 31 is formed by printing.

Unlike this embodiment, the second principal surface electrode 31 may not extend up to the boundary between the principal surface 11 and the second side surface 14. Unlike this embodiment, the dimension of the second principal surface electrode 31 in the direction Y1 may be equal to the dimension of the principal surface 11 in the direction Y1.

The second side surface electrode 32, which is shown in e.g. FIGS. 9 and 11, is formed on the second side surface 14 of the base 1. In this embodiment, the second side surface electrode 32 covers the entirety of the second side surface 14. Unlike this embodiment, the second side surface electrode 32 may not cover the entirety of the second side surface 14. That is, the second side surface 14 may be exposed from the second side surface electrode 32. Examples of the material forming the second side surface electrode 32 include Ni and Cr. In this embodiment, the second side surface electrode 32 is formed by sputtering. Thus, the thickness of the second side surface electrode 32 is very small. For instance, the thickness of the second side surface electrode 32 formed by sputtering is 100 µm. Unlike this embodiment, the second side surface electrode 32 may be formed by printing. The second side surface electrode 32 is connected to the second principal surface electrode 31. Thus, the second side surface electrode 32 is electrically connected to the second principal surface electrode 31. In this embodiment, the sputter film of the second side surface electrode 32 is not formed on the upper surface of the first principal surface electrode 31.

The second reverse surface electrode 33, which is shown in e.g. FIGS. 5 and 11, is formed on the reverse surface 12 of the base 1. The second reverse surface electrode 33 is formed at a region on the first direction X1 side of the reverse surface 12. The second reverse surface electrode 33 extends up to the boundary between the reverse surface 12 and the second side surface 14. As shown in FIG. 5, the dimension of the second reverse surface electrode 33 in the direction Y1 is equal to the dimension of the reverse surface 12 in the direction Y1. Unlike the example shown in FIG. 5, the dimension of the second reverse surface electrode 33 in the direction Y1 may be smaller than the dimension of the reverse surface 12 in the direction Y1. In this embodiment, examples of the material forming the second reverse surface electrode 33 include Ni and Cr. In this embodiment, the second reverse surface electrode 33 is formed by sputtering. Thus, the thickness of the second reverse surface electrode 33 is very small. For instance, the thickness of the second reverse surface electrode 33 formed by sputtering is 100 μm. The second reverse surface electrode 33 is connected to the second side surface electrode 32. Thus, the second reverse surface electrode 33 is electrically connected to the second side surface electrode 32. Thus, the second reverse surface electrode 33, the second side surface electrode 32 and the second principal surface electrode 31 are electrically connected to each other. Unlike this embodiment, the second reverse surface electrode 33 may be formed by printing (illustrated in FIG. 22 as a variation). In this embodiment, the second side surface electrode 32 and the first reverse surface electrode 33 are directly connected to each other.

The second auxiliary electrode 35 and the second plating electrode 37 are explained after the explanation of the overcoat 6.

The resistor element 4, which is shown in FIGS. 1-4, FIG. 10 and FIG. 11, is formed on the principal surface 11 of the base 1. The resistor element 4 is in contact with the first principal surface electrode 21 and the second principal surface electrode 31. The resistor element 4 electrically intervenes between the first principal surface electrode 21 and the second principal surface electrode 31. Part of the first principal surface electrode 21 is provided between the resistor element 4 and the principal surface 11. Also, part of the second principal surface electrode 31 is provided between the resistor element 4 and the principal surface 11. As shown in FIG. 4, the resistor element 4 is formed to bridge the first principal surface electrode 21 and the second principal surface electrode 31. In this embodiment, the dimension of the resistor element 4 in the first direction X1 is smaller than the dimension of the principal surface 11 in the first direction X1. The dimension of the resistor element 4 in the direction Y1 is smaller than the dimension of the principal surface 11 in the direction Y1. The resistor element 4 is made of a resistive material such as ruthenium oxide. For instance, the resistor element 4 is formed by printing.

Unlike this embodiment, the dimension of the resistor element 4 in the first direction X1 may be equal to the dimension of the principal surface 11 in the first direction X1. The dimension of the resistor element 4 in the direction Y1 may be equal to the dimension of the principal surface 11 in the direction Y1. Although the first principal surface electrode 21 is provided between the resistor element 4 and the principal surface 11 in the example illustrated in e.g. FIG. 2, the resistor element 4 may be provided between the principal surface 11 and the first principal surface electrode 21. Also, although the second principal surface electrode 31 is provided between the resistor element 4 and the principal surface 11 in the example shown in e.g. FIG. 2, the resistor element 4 may be provided between the principal surface 11 and the second principal surface electrode 31.

The undercoat 5, which is shown in FIGS. 1-4, FIG. 10 and FIG. 11, covers the resistor element 4. As shown in FIG. 2, the resistor element 4 is provided between the undercoat 5 and the principal surface 11. The undercoat 5 serves to alleviate thermal shock on the resistor element 4 during trimming. In this embodiment, the dimension of the undercoat 5 in the first direction X1 is larger than the dimension of the resistor element 4 in the first direction X1. Thus, the undercoat 5 is in direct contact with the first principal surface electrode 21 and the second principal surface electrode 31. The dimension of the undercoat 5 in the direction Y1 is larger than the dimension of the resistor element 4 in the direction Y1. Thus, the undercoat 5 is in direct contact with the principal surface 11. The undercoat 5 is made of a glass-based material. Examples of such a glass-based material include lead borosilicate glass. For instance, the undercoat 5 is formed by printing.

The resistor element 4 and the undercoat 5 are formed with a trimming groove 79. The trimming groove 79 is formed in the trimming process for adjusting the resistance of the chip resistor 100.

The overcoat 6, which is shown in FIGS. 1-4, 6, 7, 10, 11, covers the first principal surface electrode 21, the second principal surface electrode 31 and the resistor element 4. The overcoat 6 is made of an insulating material. Examples of such an insulating material include epoxy resin. As illustrated in FIG. 2, the overcoat 6 is in direct contact with the first principal surface electrode 21, the second principal surface electrode 31 and the undercoat 5. The first principal surface electrode 21 is provided between the overcoat 6 and the principal surface 11. Also, the second principal surface electrode 31 is provided between the overcoat 6 and the principal surface 11. The undercoat is provided between the overcoat 6 and the resistor element 4. In this embodiment, as shown in FIGS. 3 and 4, the dimension of the overcoat 6 in the direction Y1 is equal to the dimension of the principal surface 11 in the direction Y1. Thus, the overcoat 6 is in direct contact with the principal surface 11. The overcoat 6 is formed by printing.

The overcoat 6 includes an overcoat obverse surface 61. The overcoat obverse surface 61 faces in the direction Z1, i.e., the direction in which the principal surface 11 faces. The overcoat obverse surface 61 includes a flat surface 611, a first curved surface 612 and a second curved surface 613. In FIG. 4, the boundary between the flat surface 611 and the first curved surface 612 and the boundary between the flat surface 611 and the second curved surface 613 are indicated by imaginary lines (double-dashed lines).

As viewed in the direction Z1 (in plan view of the principal surface 11), the flat surface 611 overlaps the resistor element 4. The flat surface 611 is parallel to the principal surface 11. As shown in FIG. 4, in this embodiment, the flat surface 611 is positioned between the first principal surface electrode 21 and the second principal surface electrode 31 as viewed in the direction Z1. As shown in FIG. 10, the first curved surface 612 is directly connected to the flat surface 611. The first curved surface 612 is curved to become closer to the principal surface 11 as proceeding from the flat surface 611 in the second direction X2. The first curved surface 612 is in contact with the first principal surface electrode 21. As illustrated in FIG. 11, the second curved surface 613 is directly connected to the flat surface 611. The second curved surface 613 is curved to become closer to the principal surface 11 as proceeding from the flat surface 611 in the first direction X1. The second curved surface 613 is in contact with the second principal surface electrode 31.

The first auxiliary electrode 25 covers the first principal surface electrode 21 and the overcoat 6. The first auxiliary electrode 25 is in direct contact with the first principal surface electrode 21 and the overcoat 6. Between the first auxiliary electrode 25 and the principal surface 11 are provided the first principal surface electrode 21 and the overcoat 6. As illustrated in FIG. 10, the first auxiliary electrode 25 has a portion 259 offset from the first principal surface electrode 21 in the first direction X1. In other words, as viewed in the direction Z1 (in plan view of the principal surface 11), the first auxiliary electrode 25 extends beyond the end of the first principal surface electrode 21 toward the center of the base 1. Thus, the end of the first auxiliary electrode 25 in the first direction X1 is offset from the first principal surface electrode 21 in the first direction X1. As viewed in the direction Z1, the other end of the first auxiliary electrode 25 in the second direction X2 reaches the end of the principal surface 11 in the second direction X2. The first auxiliary electrode 25 is made of a resin-silver-based material containing resin and silver powder. The side surface of the first auxiliary electrode 25 is covered by the first side surface electrode 22. That is, the first auxiliary electrode 25, the first principal surface electrode 21 and the first side surface 13 of the base 1 are covered by the first side surface electrode 22.

Figure 13:
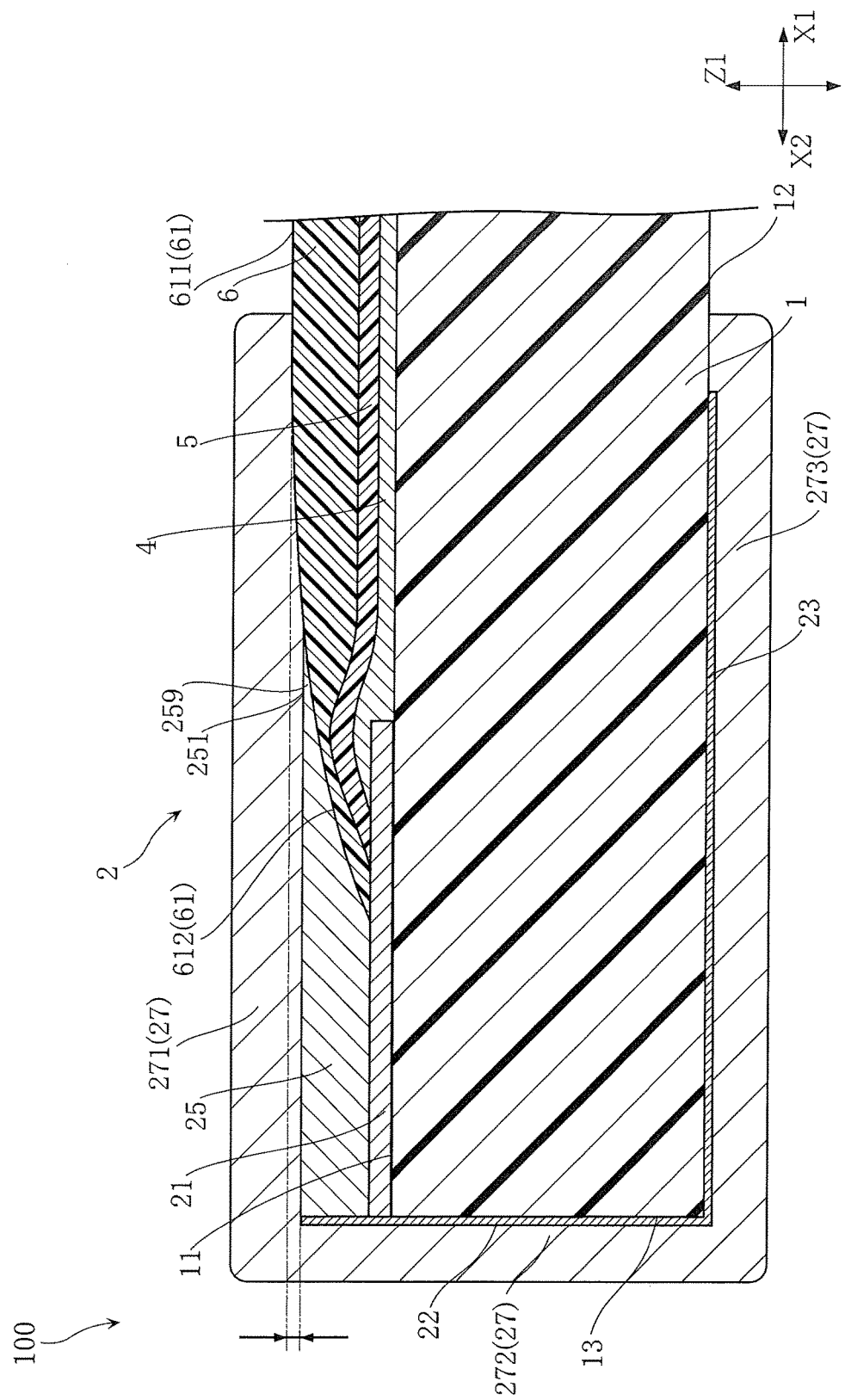
FIG. 13 is a sectional view illustrating a part of a chip resistor according to a variation of an embodiment of the present invention as enlarged.

As shown in FIG. 10, the first auxiliary electrode 25 has a first auxiliary electrode obverse surface 251. The first auxiliary electrode obverse surface 251 is covered by the first plating electrode 27 and in contact with the overcoat 6. In this embodiment, the first auxiliary electrode obverse surface 251 is flush with the overcoat obverse surface 61. In the illustrated example, the first auxiliary electrode obverse surface 251 is flush with the flat surface 611. However, as illustrated in FIG. 13, the first auxiliary electrode obverse surface 251 may be offset from the overcoat obverse surface 61 toward the principal surface 11. In the illustrated example, the first auxiliary electrode obverse surface 251 is in contact with the first curved surface 612. Preferably, the portion of the first auxiliary electrode obverse surface 251 which is offset from the first principal surface electrode 21 in the first direction X1 has a height difference of 0-10 μm from the highest point of the overcoat obverse surface 61 in the direction Z1 (height difference in FIGS. 10 and 13). More preferably, the portion of the first auxiliary electrode obverse surface 251 which is offset from the first principal surface electrode 21 in the first direction X1 has a height difference of 0-6 μm from the highest point of the overcoat obverse surface 61 in the direction Z1 (height difference in FIGS. 10 and 13). The first auxiliary electrode obverse surface 251 is generally flat from the portion above the first principal surface electrode 21 to the portion above the overcoat 6. That is, though extending over the first principal surface electrode 21 and the overcoat 6, the height of the first auxiliary electrode obverse surface 251 does not vary even when the height of the overcoat 6, located on or off the first principal surface electrode 21, changes.

Figure 12:
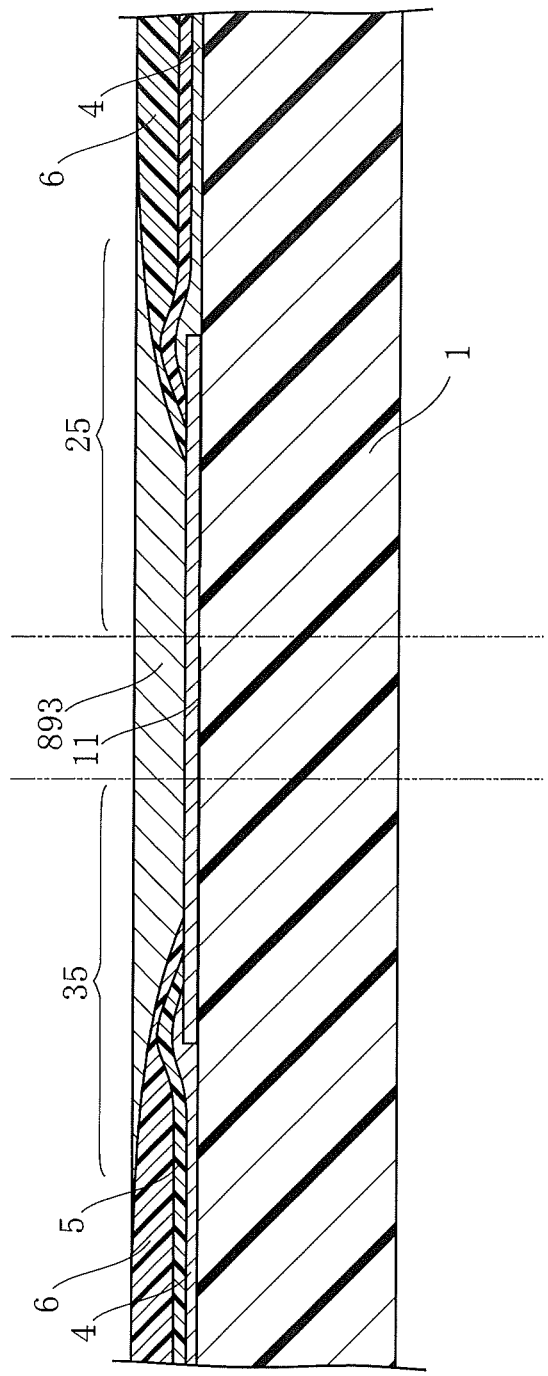
FIG. 12 is a sectional view illustrating a step of a method for making the chip resistor of FIG. 1.

The first auxiliary electrode 25 is formed as follows. FIG. 12 is a sectional view illustrating a step of a method for making the chip resistor of FIG. 1. As illustrated in FIG. 1, an electroconductive material 893 is printed between a plurality of overcoats 6 formed on the principal surface of the base 1 before cutting. The amount of the electroconductive material 893 to be printed is adjusted so that the electroconductive material 893 does not excessively cover the overcoat 6. The amount of the electroconductive material 893 printed can vary. In this embodiment, when a desired amount of electroconductive material 893 is printed, the first auxiliary electrode obverse surface 251 is offset from the overcoat obverse surface 61 toward the principal surface 11, as illustrated in FIG. 13. On the other hand, when the amount of the electroconductive material 893 is larger than the desired amount, the first auxiliary electrode obverse surface 251 can be flush with the flat surface 611, as illustrated in FIG. 10. The viscosity of the electroconductive material 893 is relatively low, which allows the first auxiliary electrode obverse surface 251 to be made flat. The printed electroconductive material 893 is hardened and baked. The base 1 is cut by dicing into individual pieces along the double-dashed lines in FIG. 12.

The first plating electrode 27, which is illustrated in FIGS. 1, 2 and 10, covers the first auxiliary electrode 25, the first side surface electrode 22 and the first reverse surface electrode 23. The first plating electrode 27 is made of at least one of Cu, Au, Ni and Sn. The first plating electrode 27 may be an alloy containing at least one of Cu, Au, Ni and Sn or copper alloy containing copper as the main component. In this embodiment, the first plating electrode 27 is made of Cu. The overcoat 6 is exposed from the first plating electrode 27. The first plating electrode 27 is 6-15 μm in thickness. The first plating electrode 27 has a portion offset from the overcoat 6 in the direction Z1. That is, in FIG. 10, the upper surface of the first plating electrode 27 is at a higher position than the overcoat obverse surface 61. Unlike this embodiment, the upper surface of the first plating electrode 27 may be flush with the overcoat obverse surface 61. When the first auxiliary electrode obverse surface 251 of the first auxiliary electrode 25 is lower than the overcoat obverse surface 61 as illustrated in FIG. 13, the first plating electrode 27 is made to have a thickness larger than the height difference between the overcoat obverse surface 61 and the first auxiliary electrode obverse surface 251. Thus, the upper surface of the first plating electrode 27 is higher than the overcoat obverse surface 61. Accordingly, the surface of the chip is lower at the center (the portion where the overcoat 6 is exposed) and higher at each end provided with a plated portion.

The first plating electrode 27 includes a first principal surface layer 271, a first side surface layer 272 and a first reverse surface layer 273.

The first principal surface layer 271 is the portion of the first plating electrode 27 which is on the principal surface 11 side of the base 1. The first principal surface layer 271 covers the first auxiliary electrode 25 and the overcoat 6. Specifically, the first principal surface layer 271 covers the first auxiliary electrode obverse surface 251 of the first auxiliary electrode 25 and the overcoat obverse surface 61 of the overcoat 6. In this embodiment, the first principal surface layer 271 covers part of the flat surface 611 of the overcoat obverse surface 61 as well. As illustrated in FIG. 10, the first principal surface layer 271 has a portion which is offset from the first reverse surface electrode 23 in the first direction X1. That is, in FIG. 10, the right end of the first principal surface layer 271 is positioned on the right side of the first reverse surface electrode 23. For instance, the dimension L21 of the first principal surface layer 271 in the first direction X1 (see FIG. 1) is 200-260 μm. The dimension of the first principal surface layer 271 in the direction Y1 is larger than the dimension of the principal surface 11 in the direction Y1.

The first side surface layer 272 covers the first auxiliary electrode 25 and the first side surface electrode 22. The first side surface layer 272 is connected to the first principal surface layer 271. As illustrated in FIG. 8, the dimension of the first side surface layer 272 in the direction Y1 is larger than the dimension of the first side surface 13 in the direction Y1.

The first reverse surface layer 273 is the portion of the first plating electrode 27 which is on the reverse surface 12 side of the base 1. The first reverse surface layer 273 covers the first reverse surface electrode 23. As illustrated in FIG. 10, the first reverse surface layer 273 has a portion which is offset from the first auxiliary electrode 25 in the first direction X1. That is, in this figure, the right end of the first reverse surface layer 273 is positioned on the right side of the first auxiliary electrode 25. For instance, the dimension L22 of the first reverse surface layer 273 in the first direction X1 (see FIG. 5) is 200-260 μm. It is preferable that the shape of the first reverse surface layer 273 is the same as that of the first principal surface layer 271. The dimension of the first reverse surface layer 273 in the direction Y1 is larger than the dimension of the reverse surface 12 in the direction Y1.

The second auxiliary electrode 35 covers the second principal surface electrode 31 and the overcoat 6. The second auxiliary electrode 35 is in direct contact with the second principal surface electrode 31 and the overcoat 6. Between the second auxiliary electrode 35 and the principal surface 11 are provided the second principal surface electrode 31 and the overcoat 6. As illustrated in FIG. 11, the second auxiliary electrode 35 has a portion 359 offset from the second principal surface electrode 31 in the second direction X2. In other words, as viewed in the direction Z1, the second auxiliary electrode 35 extends beyond the end of the second principal surface electrode 31 toward the center of the base 1. Thus, the end of the second auxiliary electrode 35 in the second direction X2 is offset from the second principal surface electrode 31 in the second direction X2. As viewed in the direction Z1, the other end of the second auxiliary electrode 35 in the first direction X1 reaches the end of the principal surface 11 in the first direction X1. The second auxiliary electrode 35 is made of a resin-silver-based material containing resin and silver powder. The side surface of the second auxiliary electrode 35 is covered by the second side surface electrode 32. That is, the second auxiliary electrode 35, the second principal surface electrode 31 and the second side surface 14 of the base 1 are covered by the second side surface electrode 32.

Figure 14:
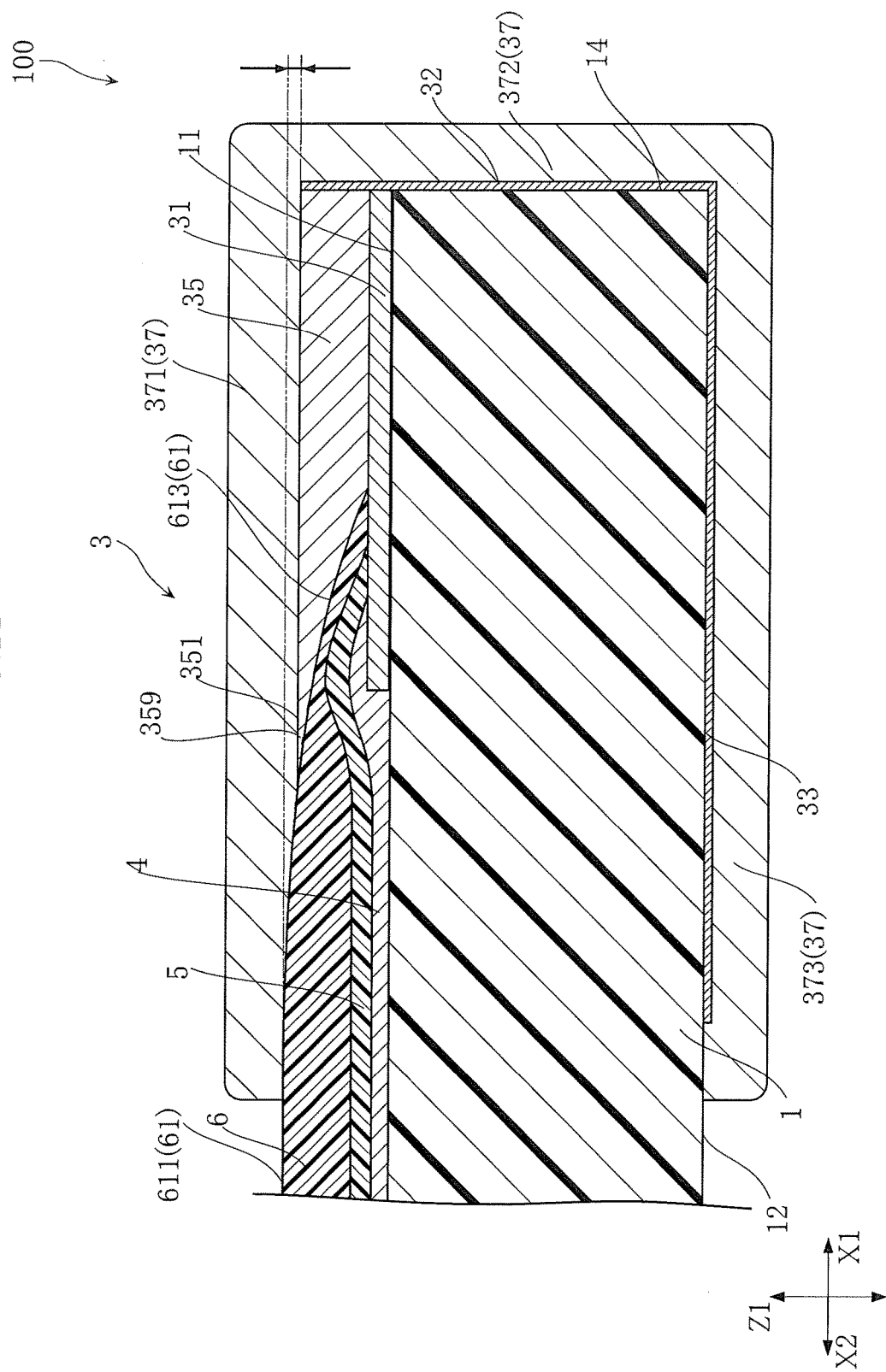
FIG. 14 is a sectional view illustrating a part of a chip resistor according to a variation of an embodiment of the present invention as enlarged.

As shown in FIG. 11, the second auxiliary electrode 35 has a second auxiliary electrode obverse surface 351. The second auxiliary electrode obverse surface 351 is covered by the second plating electrode 37 and in contact with the overcoat 6. In this embodiment, the second auxiliary electrode obverse surface 351 is flush with the overcoat obverse surface 61. In the illustrated example, the second auxiliary electrode obverse surface 351 is flush with the flat surface 611. However, as illustrated in FIG. 14, the second auxiliary electrode obverse surface 351 may be offset from the overcoat obverse surface 61 toward the principal surface 11. In the illustrated example, the second auxiliary electrode obverse surface 351 is in contact with the second curved surface 613. Preferably, the portion of the second auxiliary electrode obverse surface 351 which is offset from the second principal surface electrode 31 in the second direction X2 has a height difference of 0-10 μm from the highest point of the overcoat obverse surface 61 in the direction Z1 (height difference in FIGS. 11 and 14). More preferably, the portion of the second auxiliary electrode obverse surface 351 which is offset from the second principal surface electrode 31 in the second direction X2 has a height difference of 0-6 μm from the highest point of the overcoat obverse surface 61 in the direction Z1 (height difference in FIGS. 11 and 14). The second auxiliary electrode obverse surface 351 is generally flat from the portion above the second principal surface electrode 31 to the portion above the overcoat 6. That is, though extending over the second principal surface electrode 31 and the overcoat 6, the height of the second auxiliary electrode obverse surface 351 does not vary even when the height of the overcoat 6, located on and off the second principal surface electrode 31, changes.

The second auxiliary electrode 35 is formed by the same process as that for forming the first auxiliary electrode 25. Thus, explanation of the process for forming the second auxiliary electrode 35 is omitted.

The first plating electrode 37, which is illustrated in FIGS. 1, 2 and 11, covers the second auxiliary electrode 35, the second side surface electrode 32 and the second reverse surface electrode 33. The second plating electrode 37 is made of at least one of Cu, Au, Ni and Sn. The second plating electrode 37 may be an alloy containing at least one of Cu, Au, Ni and Sn or copper alloy containing copper as the main component. In this embodiment, the second plating electrode 37 is made of Cu. The overcoat 6 is exposed from the second plating electrode 37. The second plating electrode 37 is 6-15 μm in thickness. The second plating electrode 37 has a portion offset from the overcoat 6 in the direction Z1. That is, in FIG. 11, the upper surface of the second plating electrode 37 is at a higher position than the overcoat obverse surface 61. Unlike this embodiment, the upper surface of the second plating electrode 37 may be flush with the overcoat obverse surface 61.

The second plating electrode 37 includes a second principal surface layer 371, a second side surface layer 372 and a second reverse surface layer 373.

The second principal surface layer 371 is the portion of the second plating electrode 37 which is on the principal surface 11 side of the base 1. The second principal surface layer 371 covers the second auxiliary electrode 35 and the overcoat 6. Specifically, the second principal surface layer 371 covers the second auxiliary electrode obverse surface 351 of the second auxiliary electrode 35 and the overcoat obverse surface 61 of the overcoat 6. In this embodiment, the second principal surface layer 371 covers part of the flat surface 611 of the overcoat obverse surface 61 as well. As illustrated in FIG. 11, the second principal surface layer 371 has a portion which is offset from the second reverse surface electrode 33 in the second direction X2. That is, in this figure, the left end of the second principal surface layer 371 is positioned on the left side of the second reverse surface electrode 33. For instance, the dimension L31 of the second principal surface layer 371 in the second direction X2 (see FIG. 1) is 200-260 μm. The dimension of the second principal surface layer 371 in the direction Y1 is larger than the dimension of the principal surface 11 in the direction Y1.

The second side surface layer 372 covers the second auxiliary electrode 35 and the second side surface electrode 32. The second side surface layer 372 is connected to the second principal surface layer 371. As illustrated in FIG. 9, the dimension of the second side surface layer 372 in the direction Y1 is larger than the dimension of the second side surface 14 in the direction Y1.

The second reverse surface layer 373 is the portion of the second plating electrode 37 which is on the reverse surface 12 side of the base 1. The second reverse surface layer 373 covers the second reverse surface electrode 33. As illustrated in FIG. 11, the second reverse surface layer 373 has a portion which is offset from the second auxiliary electrode 35 in the second direction X2. That is, in this figure, the left end of the second reverse surface layer 373 is positioned on the left side of the second auxiliary electrode 35. For instance, the dimension L32 of the second reverse surface layer 373 in the second direction X2 (see FIG. 5) is 200-260 µm. It is preferable that the shape of the second reverse surface layer 373 is the same as that of the second principal surface layer 371. The dimension of the second reverse surface layer 373 in the direction Y1 is larger than the dimension of the reverse surface 12 in the direction Y1.

Figure 15:
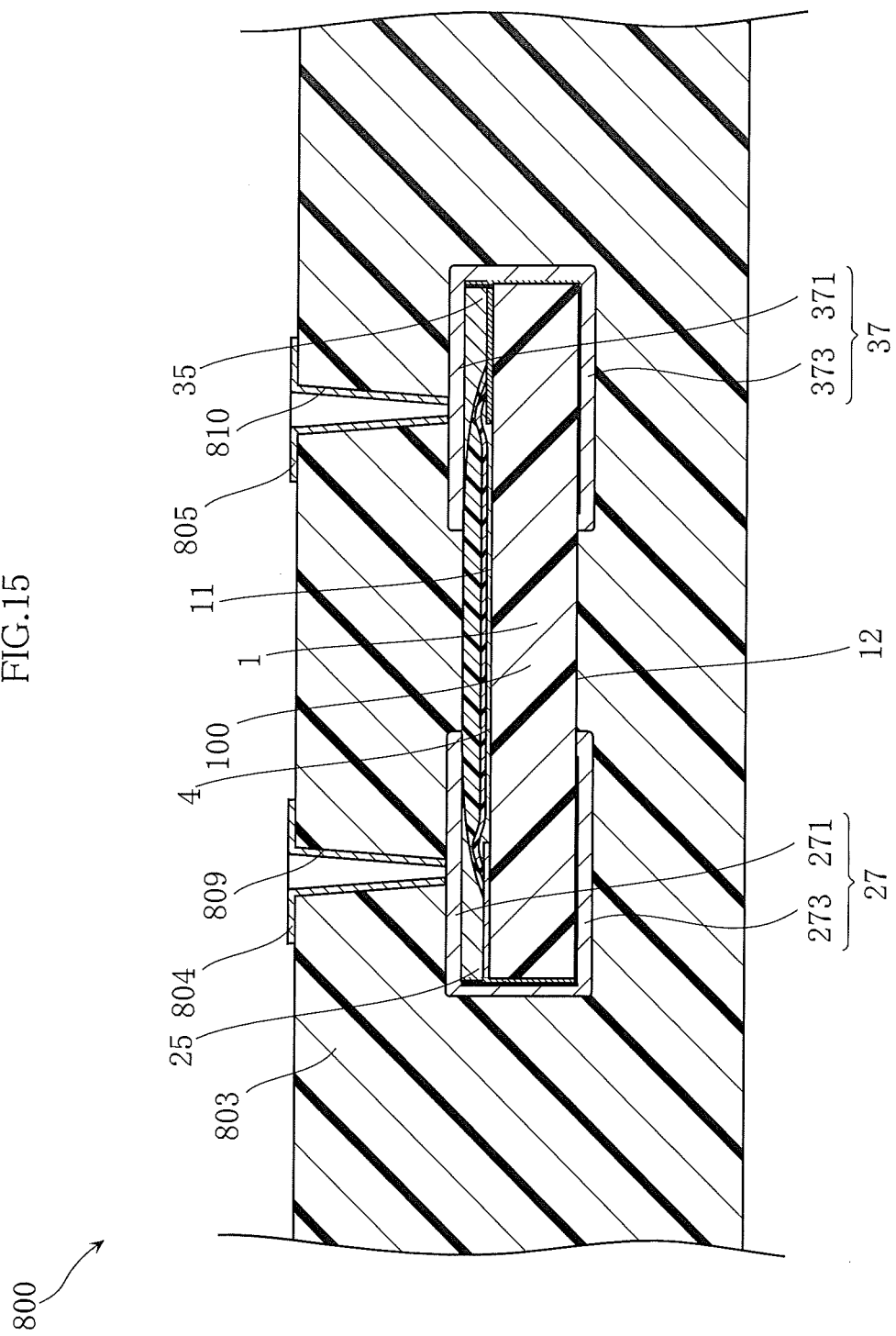
FIG. 15 is a sectional view of an electronic device according to an embodiment of the present invention.

FIG. 15 is a sectional view of an electronic device according to an embodiment of the present invention.

The electronic device 800 illustrated in the figure includes a chip resistor 100, a filled-resin board 803, a first conductive layer 804 and a second conductive layer 805.

The filled-resin board 803 surrounds the chip resistor 100. In the electronic device 800 shown in FIG. 15, the reverse surface 12 of the base 1 faces in the downward direction. The filled-resin board 803 is in close contact with the chip resistor 100. Specifically, there is no gap between the filled-resin board 803 and the first plating electrode 27, the second plating electrode 37, the base 1 or the overcoat 6. For instance, the filled-resin board 803 is made of an insulating resin. Examples of such a resin include glass epoxy resin. The filled-resin board 803 is formed with a first via 809 and a second via 810. The first via 809 and the second via 810 are dented from the obverse surface of the filled-resin board 803.

The material for forming the first conductive layer 804 and the second conductive layer 805 is not limited to a specific one and is Cu in this embodiment. The first conductive layer 804 is formed on the obverse surface of the filled-resin board 803 and the inner surface defining the first via 809. The first conductive layer 804 is connected to the chip resistor 100 physically and electrically. The first conductive layer 804 is in direct contact with the first principal surface layer 271 of the first plating electrode 27. The second conductive layer 805 is formed on the obverse surface of the filled-resin board 803 and the inner surface defining the second via 810. The second conductive layer 805 is connected to the chip resistor 100 physically and electrically. The second conductive layer 805 is in direct contact with the second principal surface layer 371 of the second plating electrode 37.

An example of a method for making the electronic device 800 is briefly described below.

Figure 16:
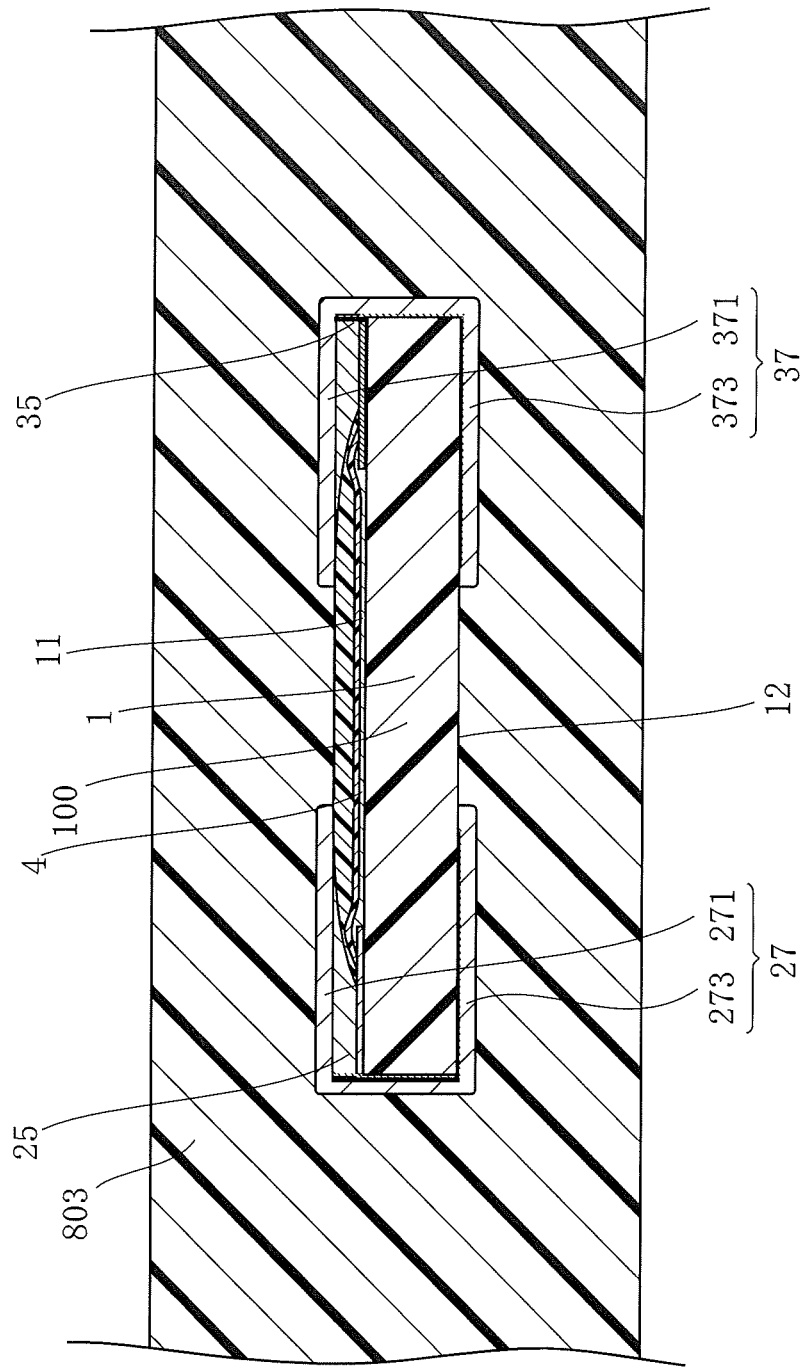
FIG. 16 is a sectional view illustrating a step of a method for making an electronic device according to an embodiment of the present invention.

The filled-resin board 803 incorporating the chip resistor 100 as illustrated in FIG. 16 is made by a known process. This process includes arranging the chip resistor 100 on a support plate hardened in advance. In arranging the chip resistor 100 on the support plate, stress is exerted on the chip resistor 100. Even in such a case, according to the present invention, it is possible to prevent the chip resistor 100 from breaking. This will be described in detail later.

Figure 17:
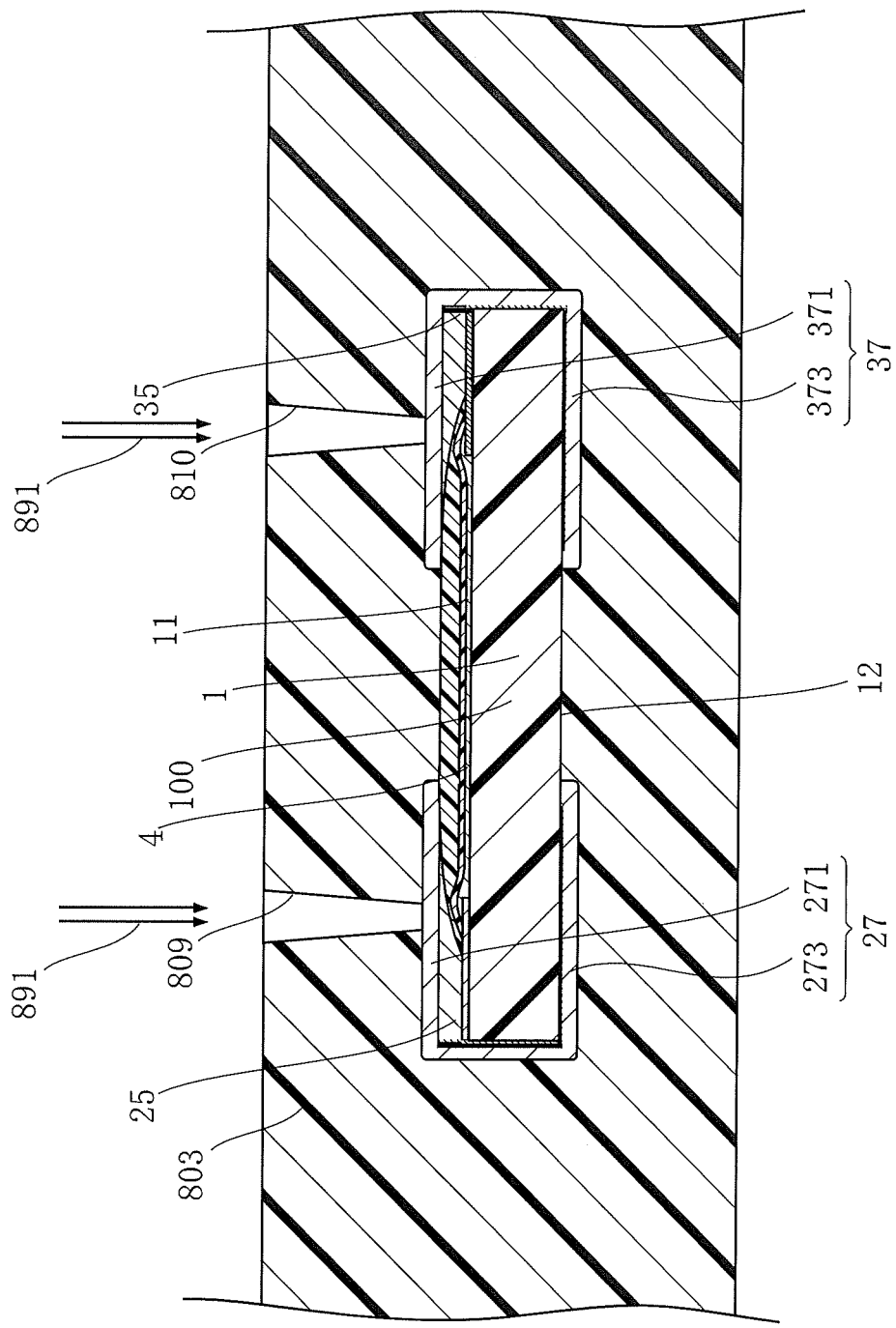
FIG. 17 is a sectional view illustrating the step subsequent to FIG. 16.

Then, as shown in FIG. 17, the first via 809 and the second via 810 are formed in the filled-resin board 803 by applying laser beams 891 to the filled-resin board 803. The laser beams 891 are directed at the center of each of the first principal surface layer 271 and the second principal surface layer 371.

Then, surface treatment using an acid liquid is performed to the inner surfaces defining the first via 809 and the second via 810 and to the surface of the filled-resin board 803. Then, the first conductive layer 804 (see FIG. 15) is formed on the inner surface defining the first via 809 and the surface of the filled-resin board 803, and the second conductive layer 805 (see FIG. 15) is formed on the inner surface defining the second via 810 and the surface of the filled-resin board 803. The formation of the first and second conductive layers 804, 805 is performed by plating. As a result, the electronic device 800 is obtained.

In the example illustrated in FIG. 15, the conductive layer electrically connected to the first plating electrode 27 is the single first conductive layer 804 only. However, a plurality of conductive layers may be electrically connected to the first plating electrode 27. Similarly, in the example illustrated in the figure, the conductive layer electrically connected to the second plating electrode 37 is the single second conductive layer 805 only. However, a plurality of conductive layers may be connected to the second plating electrode 37.

Figure 18:
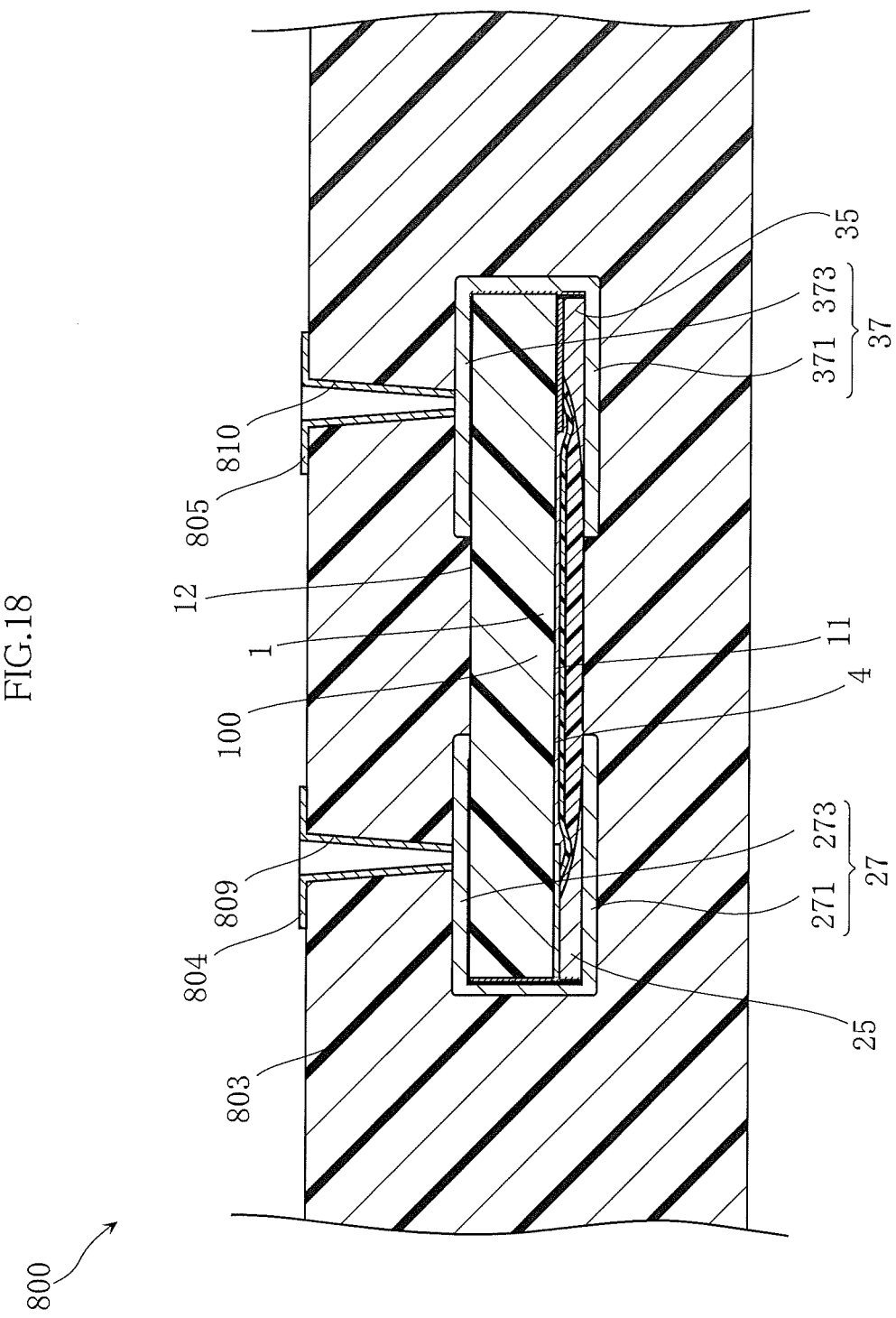
FIG. 18 is a sectional view of an electronic device according to a variation of an embodiment of the present invention.

FIG. 18 is a sectional view of an electronic device according to a variation of the embodiment of the present invention.

The electronic device 800 illustrated in this figure is different from the electronic device 800 illustrated in FIG. 15 in that the chip resistor 100 is reversed. Specifically, in the electronic device 800 illustrated in FIG. 18, the principal surface 11 of the base 1 faces in the downward direction. The first conductive layer 804 and the second conductive layer 805 are connected to the chip resistor 100 physically and electrically. The first conductive layer 804 is in direct contact with the first reverse surface layer 273 of the first plating electrode 27. The second conductive layer 805 is in direct contact with the second reverse surface layer 373 of the second plating electrode 37. The electronic device 800 illustrated in FIG. 18 is made in the same way as the electronic device 800 shown in FIG. 15. Thus, the explanation of the making method is omitted.

Advantages of this embodiment are described below.

As illustrated in FIG. 10, in this embodiment, part of the first auxiliary electrode 25 is offset from the first principal surface electrode 21 in the first direction X1. This arrangement increases the dimension of the first auxiliary electrode 25 in the first direction X1. When the dimension of the first auxiliary electrode 25 in the first direction X1 is increased, the dimension in the first direction X1 of the portion of the principal surface 11 of the first plating electrode 27 which covers the first auxiliary electrode 25 (i.e., the first principal surface layer 271) can be increased. By increasing the dimension of the first principal surface layer 271 in the first direction X1, the first principal surface layer 271 can have a large area to which laser beams 891 can be applied. This assures that the first via 809 is formed in the filled-resin board 803 reliably at a position overlapping the first principal surface layer 271 as viewed in the direction Z1 without the need for applying the laser beams 891 with extremely high positional accuracy. Thus, the first principal surface layer 271 is reliably bonded to the first conductive layer 804, which is a conductive layer provided separately from the chip resistor 100, without the need for applying the laser beams 891 with extremely high positional accuracy.

By increasing the dimension of the first principal surface layer 271 in the first direction X1, the area of the overcoat 6 which is exposed from the first plating electrode 27 can be reduced. Thus, the overcoat 6 is prevented from being damaged due to erroneous application of laser beams 891 to the overcoat 6.

As shown in FIG. 11, in this embodiment, part of the second auxiliary electrode 35 is offset from the second principal surface electrode 31 in the second direction X2. According to this arrangement, for the same reason as that described above, the second principal surface layer 371 is reliably bonded to the second conductive layer 805, which is a conductive layer provided separately from the chip resistor 100, without the need for applying the laser beams 891 with extremely high positional accuracy. According to this arrangement again, the area of the overcoat 6 which is exposed from the second plating electrode 37 is reduced. Thus, the overcoat 6 is prevented from being damaged due to erroneous application of laser beams 891 to the overcoat 6.

In general, when an electrode to be plated has a larger area, the plating is more easily formed into a desired shape. Since the dimension of the first auxiliary electrode 25 in the first direction X1 is increased in this embodiment, the first plating electrode 27 to cover the first auxiliary electrode 25 can be easily formed into a desired shape. Also, since the dimension of the second auxiliary electrode 35 in the second direction X2 is increased in this embodiment, the second plating electrode 37 for covering the second auxiliary electrode 35 can be easily formed into a desired shape.

As illustrated in FIG. 10, in this embodiment, part of the first plating electrode 27 is offset from the overcoat 6 in the direction Z1. According to this arrangement, when the chip resistor 100 is to be sucked by a nozzle on the principal surface 11 side, the nozzle comes into contact with the portion of the first plating electrode 27 on the principal surface 11 side the first principal surface layer 271) and is unlikely to come into direct contact with the overcoat 6. In particular, the nozzle is less likely to come into contact with the overcoat 6 as compared with a conventional structure in which the width of the electrode is small and the width of the exposed area of the overcoat is large. If mounting is performed with the overcoat 6 directly sucked, a large stress is exerted on the chip during the mounting, so that the chip may break easily. According to the present embodiment, the nozzle is unlikely to come into contact with the overcoat 6, so that the chip resistor 100 is prevented from breaking. According to this embodiment, as noted above, the dimension of the first principal surface layer 271 in the first direction X1 can be increased. Thus, when the chip resistor 100 is being mounted on a mount object with the principal surface 11 side of the chip resistor 100 sucked by a nozzle, a force is likely to be applied to inner parts of the base 1. Thus, the force which may otherwise break the base 1 can be reduced, so that base 1 will not crack or totally break.

As illustrated in FIG. 11, in this embodiment, part of the second plating electrode 37 is offset from the overcoat 6 in the direction Z1. According to this arrangement, for the same reason as that described above, the base 1 is prevented from breaking.

In this embodiment, the first auxiliary electrode 25 has the first auxiliary electrode obverse surface 251 covered by the first plating electrode 27 and in contact with the overcoat 6. The overcoat 6 has the overcoat obverse surface 61 facing in the direction Z1. The first auxiliary electrode obverse surface 251 is flush with the overcoat obverse surface 61 or offset from the overcoat obverse surface 61 toward the principal surface 11. According to this arrangement, the upper surface of the first plating electrode 27 covering the overcoat obverse surface 61 in FIG. 10 does not need to be made considerably high. This is suitable for reducing the dimension of the chip resistor 100 in the direction Z1.

In this embodiment, the second auxiliary electrode 35 has the second auxiliary electrode obverse surface 351 covered by the second plating electrode 37 and in contact with the overcoat 6. The second auxiliary electrode obverse surface 351 is flush with the overcoat obverse surface 61 or offset from the overcoat obverse surface 61 toward the principal surface 11. For the same reason as that described above, this arrangement is suitable for reducing the dimension of the chip resistor 100 in the direction Z1.

In this embodiment, the portion of the first auxiliary electrode obverse surface 251 which is offset from the first principal surface electrode 21 in the first direction X1 has a height difference of 0-10 μm with respect to the highest point of the overcoat obverse surface 61 in the direction Z1 (see the height difference in FIGS. 10 and 13). Preferably, the portion of the first auxiliary electrode obverse surface 251 which is offset from the first principal surface electrode 21 in the first direction X1 has a height difference of 0-6 μm with respect to the highest point of the overcoat obverse surface 61 in the direction Z1 (the height difference in FIGS. 10 and 13). Thus, the portion of the first auxiliary electrode obverse surface 251 which is offset from the first principal surface electrode 21 in the first direction X1 is substantially flat. This arrangement allows the upper surface of the first principal surface layer 271 of the first plating electrode 27 to be flat. The flatness of the upper surface of the first principal surface layer 271 prevents an undesired gap from forming between the first principal surface layer 271 and the filled-resin board 803. Similarly, it is possible to prevent an undesired gap from forming between the second principal surface layer 371 and the filled-resin board 803.

According to this embodiment, the base 1 has the reverse surface 12 facing away from the principal surface 11. The chip resistor 100 has the first reverse surface electrode 23 and the second reverse surface electrode 33. The first reverse surface electrode 23 is formed on the reverse surface 12 and covered by the first plating electrode 27. The second reverse surface electrode 33 is formed on the reverse surface 12 and covered by the second plating electrode 37. According to this arrangement, as illustrated in FIG. 18, the portion (the first reverse surface layer 273) of the first plating electrode 27 which covers the first reverse surface electrode 23 can be bonded to the first conductive layer 804. Thus, according to the chip resistor 100, the first principal surface layer 271 can be bonded to the first conductive layer 804 as illustrated in FIG. 15 or the first reverse surface layer 273 can be bonded to the first conductive layer 804 as illustrated in FIG. 18. Similarly, according to the chip resistor 100, the second principal surface layer 371 can be bonded to the second conductive layer 805 as illustrated in FIG. 15 or the second reverse surface layer 373 can be bonded to the second conductive layer 805 as illustrated in FIG. 18. That is, the chip resistor 100 can be arranged in the filled-resin board 803 without paying any attention to which side of the chip resistor 100 is up or down. On the other hand, in the conventional resistor, only the lower electrodes are large in width, and this forces the resistor to be arranged with the predetermined orientation in a filled-resin board. In this case, normally, laser beams are applied on the bottom side of the chip resistor, as shown in FIG. 18, to be in electrical connection with the incorporated board. However, there may be an occasion where the electrical connection is desired to be established with respect to the upper side of the chip resistor, as shown in FIG. 15. In light of these different cases, conventionally, two taping lines need to be prepared for carrying a group of chip resistors with their bottom surfaces oriented upward and another group of chip resistors with their top surfaces oriented upward. According to the above embodiment of the present invention, use may be made of only a single taping line since proper electrical connection can be established with respect to either side, i.e., up side or down side, of the chip resistors 100.

Moreover, both of the obverse surface side and the reverse surface side of the filled-resin board 803 can be electrically connected to the chip resistor 100. Specifically, in FIG. 15, vias can be provided not only on the second principal surface layer 371 side (first principal surface layer 271 side) but also on the second reverse surface layer 373 side (first reverse surface layer 273 side) so that electrical conduction can be established on the reverse surface side of the substrate as well. This cannot be realized by the conventional structure.

A second embodiment of the present invention is described below with reference to FIGS. 19 and 20.

Figure 19:
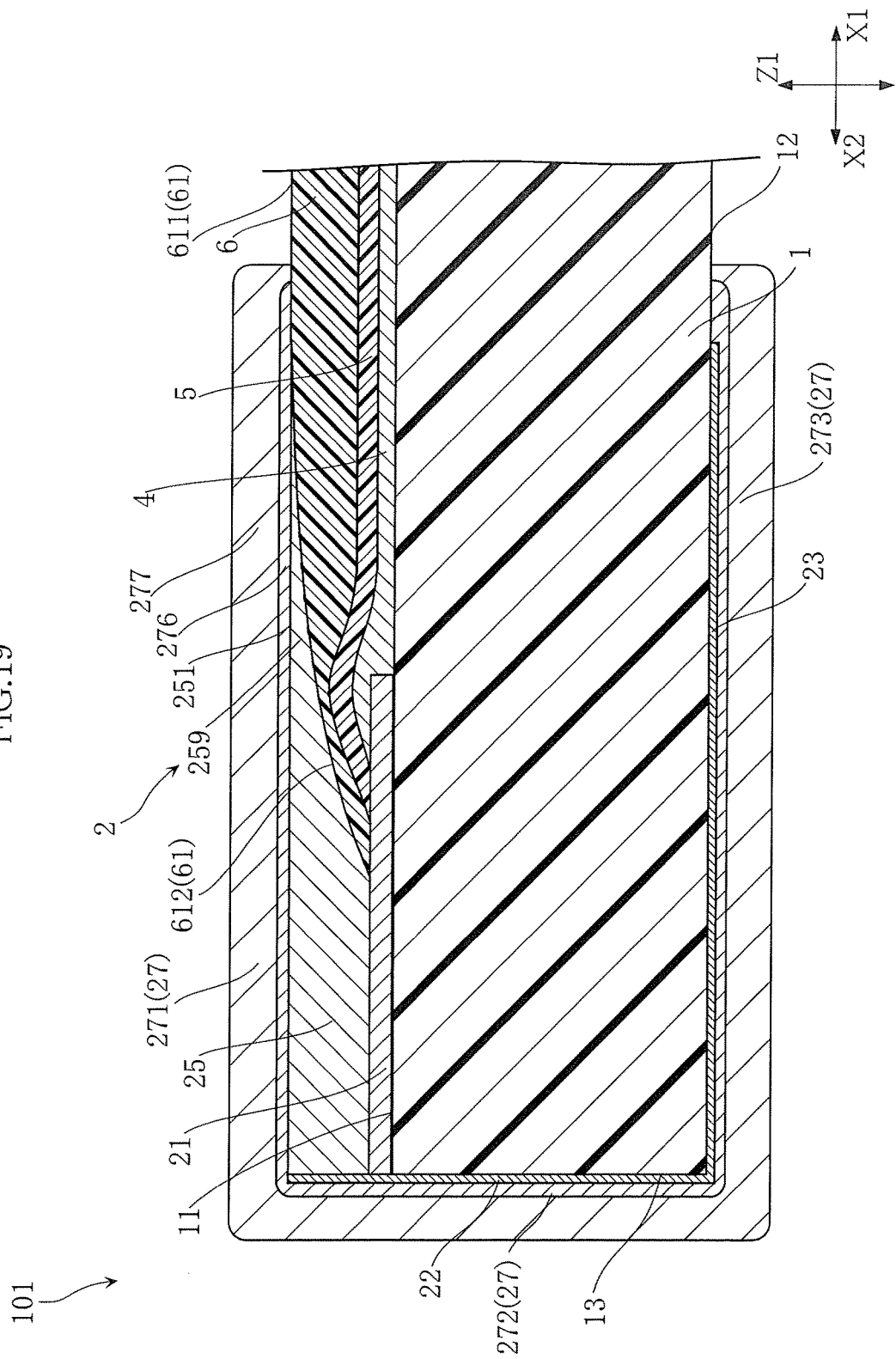
FIG. 19 is a sectional view illustrating a part of the chip resistor according to a second embodiment of the present invention as enlarged.
Figure 20:
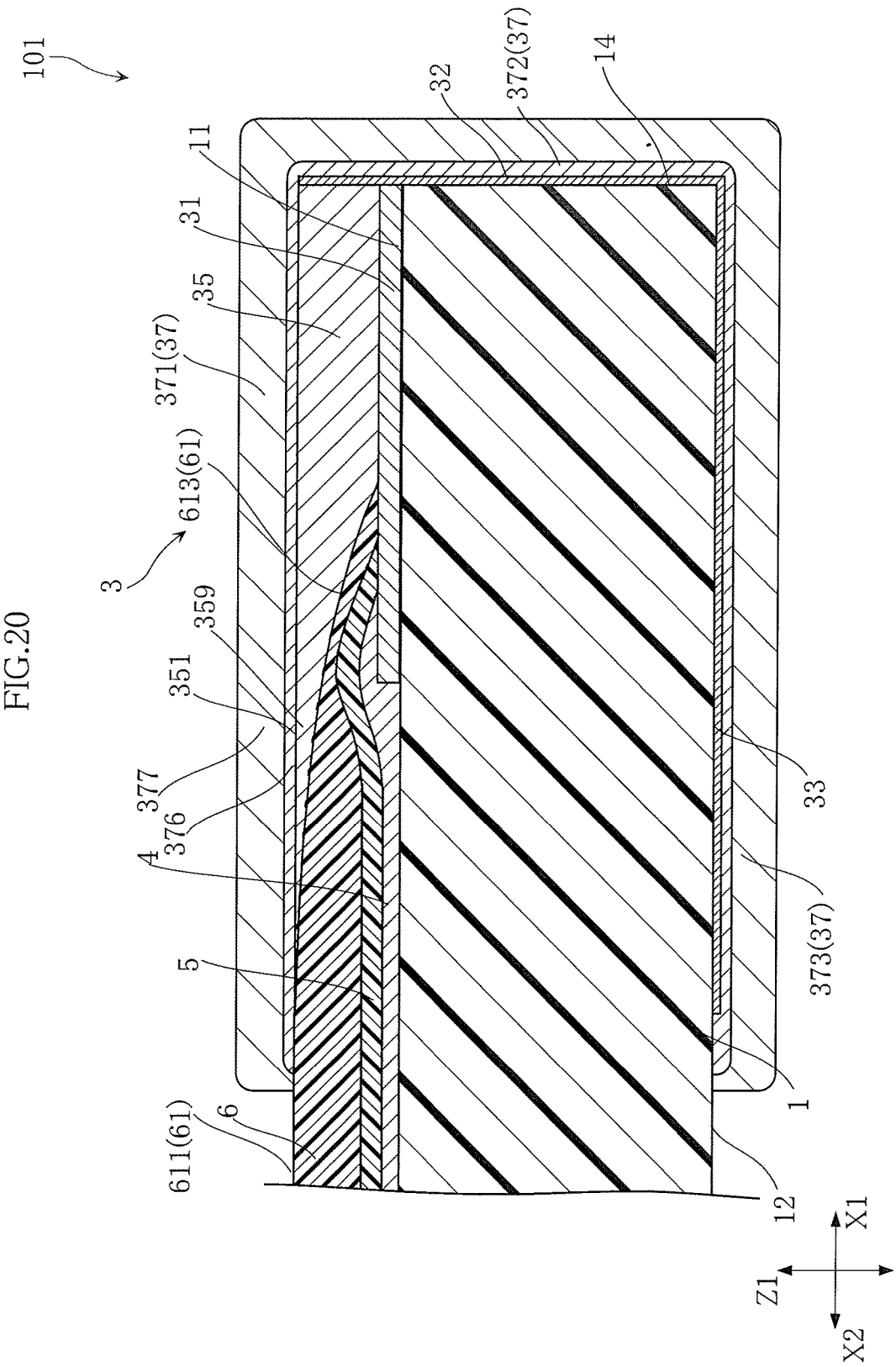
FIG. 20 is a sectional view illustrating a part of the chip resistor according to a second embodiment of the present invention as enlarged.

FIGS. 19 and 20 are sectional views illustrating portions of the chip resistor according to the second embodiment of the present invention as enlarged.

As illustrated in FIGS. 19 and 20, this embodiment differs from the foregoing embodiment in that the first plating electrode 27 includes a first layer 276 and a second layer 277 and that the second plating electrode 37 includes a first layer 376 and a second layer 377. Other elements are the same as those of the foregoing embodiment and designated by the same reference signs as those used for the foregoing embodiment. Explanation of these elements is omitted.

As illustrated in FIG. 19, part of the first layer 276 is positioned between the second layer 277 and the first auxiliary electrode 25. In this embodiment, the first layer 276 is provided on the first auxiliary electrode 25, the first side surface electrode 22 and the first reverse surface electrode 23. In this embodiment, the first layer 276 is in direct contact with the overcoat 6 and the base 1. For instance, the first layer 276 is about 2-7 μm in thickness. For instance, the first layer 276 is made of Ni. The first layer 276 is made by plating.

The second layer 277 is provided on the first layer 276. In this embodiment, the second layer 277 is larger in thickness than the first layer 276. For instance, the second layer 277 is 5-15 μm in thickness. For instance, the second layer 277 is made of at least one of Cu, Au and Sn. The second layer 277 is formed by plating.

As shown in FIG. 20, part of the first layer 376 is positioned between the second layer 377 and the second auxiliary electrode 35. In this embodiment, the first layer 376 is provided on the second auxiliary electrode 35, the second side surface electrode 32 and the second reverse surface electrode 33. In this embodiment, the first layer 376 is in direct contact with the overcoat and the base 1. For instance, the first layer 376 is 2-7 μm in thickness. For instance, the first layer 376 is made of Ni. The first layer 376 is formed by plating.

The second layer 377 is provided on the first layer 376. In this embodiment, the second layer 377 is larger in thickness than the first layer 376. For instance, the second layer 377 is 5-15 μm in thickness. For instance, the second layer 377 is made of at least one of Cu, Au and Sn. The second layer 377 is formed by plating.

In order to make the thickness of the chip resistor 101 substantially equal to the thickness of the chip resistor 100, it is preferable to make the thickness of the base 1 of this embodiment smaller by 10 μm than that of the base 1 of the chip resistor 100 illustrated in e.g. FIG. 10.

This embodiment provides the following advantages in addition to the advantages described with reference to FIGS. 1-18.

The chip resistors 101 of this embodiment are tape-packaged for transfer. In tape-packaging, some magnets may be placed under the tape on which chip resistors 101 are mounted. In the present embodiment, the first layers 276 and 376 are made of Ni, which is a ferromagnetic material. Thus, as the chip resistors 101 are placed on the tape, the first layers 276, 376 are magnetized. Advantageously, the plurality of chip resistors 101 can be aligned by the magnetic force.

The structure of the first plating electrode 27 which includes the first layer 276 and the second layer 277 may be employed in the chip resistor 100 illustrated in FIG. 13. The structure of the second plating electrode 37 which includes the first layer 376 and the second layer 377 may be applied to the chip resistor 100 illustrated in FIG. 14. The chip resistor 101 of this embodiment may be used for the electronic device 800 illustrated in FIGS. 15 and 18, instead of the chip resistor 100.

FIGS. 21-24 are sectional views illustrating chip resistors according to variations of the embodiment of the present invention as enlarged.

Figure 21:
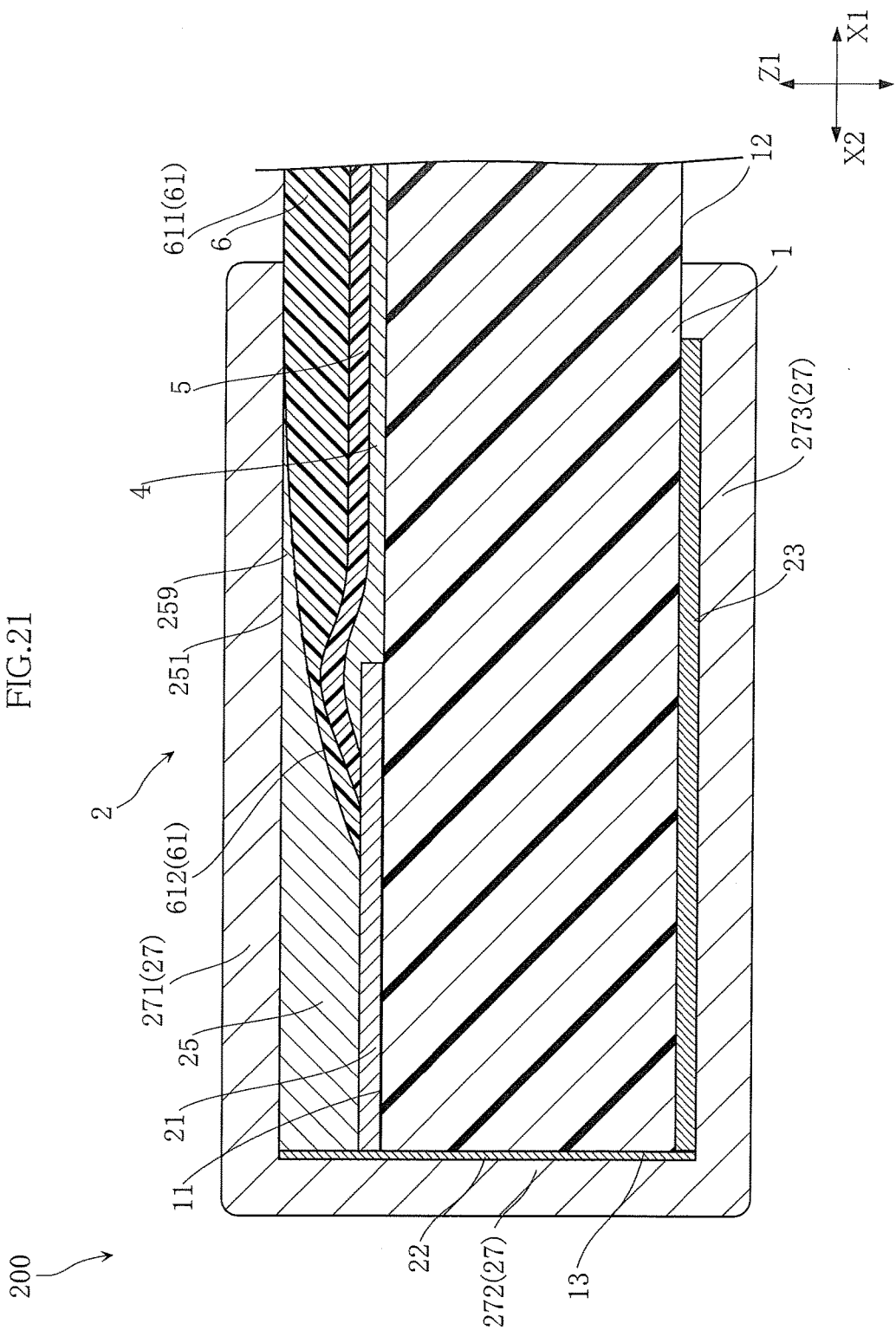
FIG. 21 is a sectional view illustrating a part of a chip resistor according to a variation of an embodiment of the present invention as enlarged.
Figure 22:
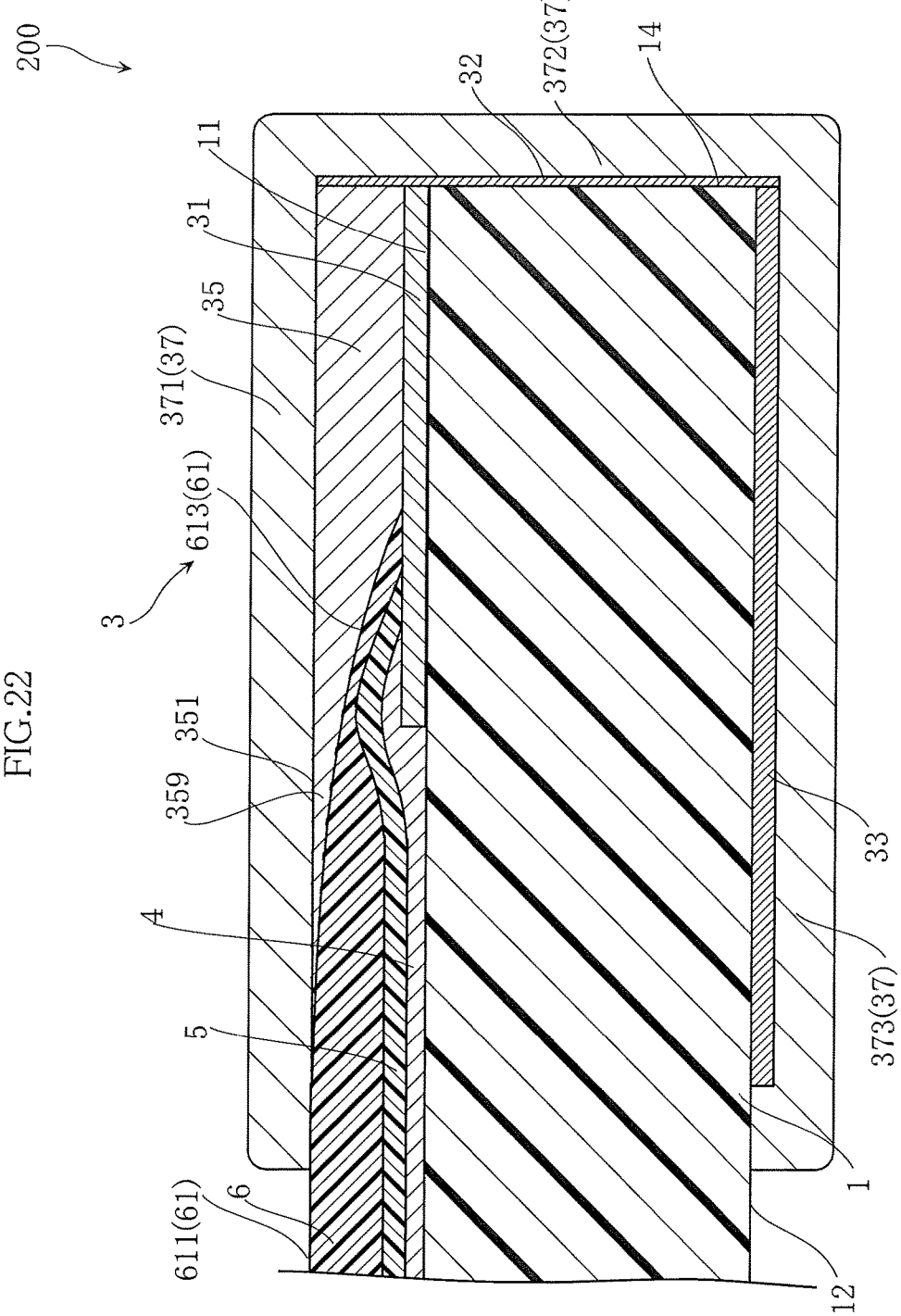
FIG. 22 is a sectional view illustrating a part of a chip resistor according to a variation of an embodiment of the present invention as enlarged.

The chip resistor 200 shown in FIGS. 21 and 22 differs from the chip resistor 100 of the first embodiment in that the first reverse surface electrode 23 and the second reverse surface electrode 33 are formed by printing. The other elements of the chip resistor 200 are the same as those of the chip resistor 100, so that the explanation is omitted. In the chip resistor 200, the first side surface electrode 22 is formed by sputtering. In this variation, the first side surface electrode 22 is formed, by sputtering, only on the first principal surface electrode 21, the first side surface 13 of the base 1, the side surface of the first reverse surface electrode 25 and the side surface of the first auxiliary electrode 25. In the chip resistor 200, the second side surface electrode 32 is formed by sputtering. In this variation, the second side surface electrode 32 is formed, by sputtering, only on the second principal surface electrode 31, the second side surface 14 of the base 1, the side surface of the second reverse surface electrode 35 and the side surface of the second auxiliary electrode 35.

Although the chip resistor 200 of this variation is described as a variation of the chip resistor 100, formation of the first reverse surface electrode 23 and the second reverse surface electrode 33 by printing may be employed as a variation of the chip resistor 101 according to the second embodiment.

Figure 23:
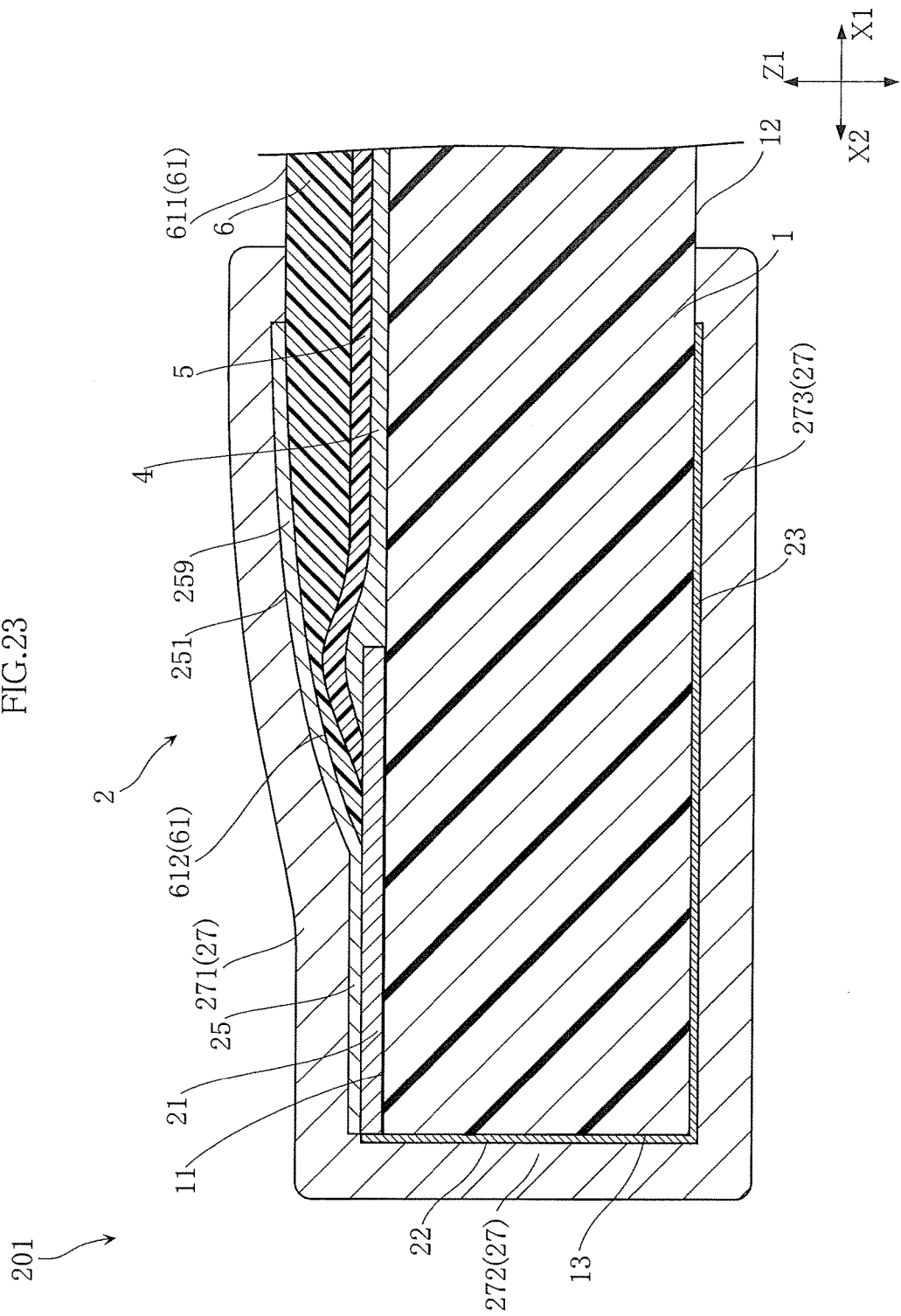
FIG. 23 is a sectional view illustrating a part of a chip resistor according to a variation of an embodiment of the present invention as enlarged.
Figure 24:
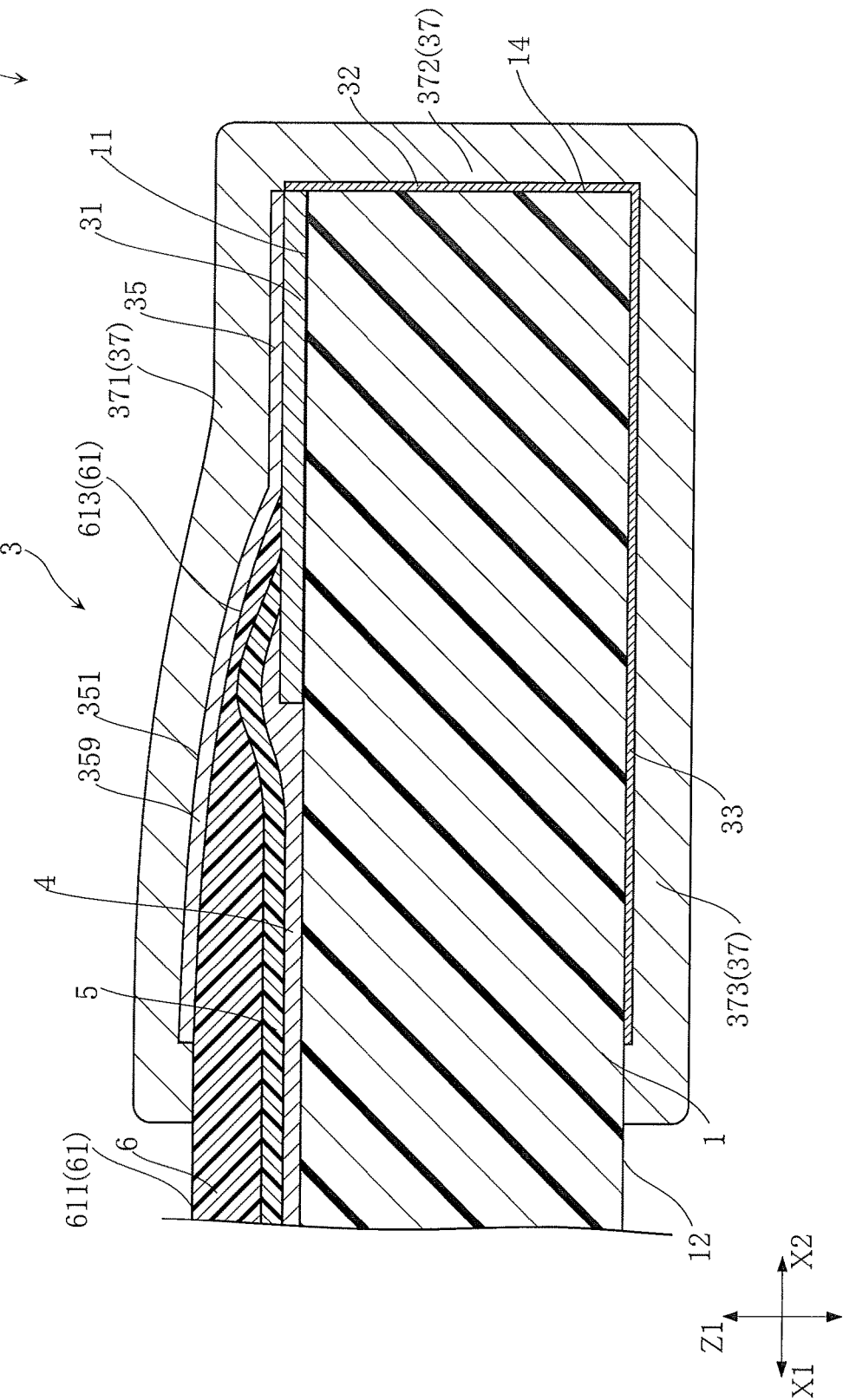
FIG. 24 is a sectional view illustrating a part of a chip resistor according to a variation of an embodiment of the present invention as enlarged.

The chip resistor 201 illustrated in FIGS. 23 and 24 differs from the chip resistor 100 of the first embodiment in that the first auxiliary electrode 25 and the second auxiliary electrode 35 are formed by sputtering. In this case, since the thickness of the first auxiliary electrode is considerably smaller than the thickness of the overcoat 6, the shape of the obverse surface of the first plating electrode 27 reflects the shapes of the obverse surface of the first principal surface electrode 21 and the obverse surface of the overcoat 6. Similarly, since the thickness of the second auxiliary electrode 35 is considerably smaller than the thickness of the overcoat 6, the shape of the obverse surface of the second plating electrode 37 reflects the shapes of the obverse surface of the second principal surface electrode 31 and the obverse surface of the overcoat 6. In this variation, the first side surface electrode 22, the first reverse surface electrode 23, the second side surface electrode 32 and the second reverse surface electrode 33 are preferably formed by sputtering.

Although the chip resistor 201 of this variation is described as a variation of the chip resistor 100, formation of the first auxiliary electrode 25 and the second auxiliary electrode 35 by sputtering may be employed as a variation of the chip resistor 101 according to the second embodiment. The chip resistor 200 and the chip resistor 201 may be combined.

The present invention is not limited to the foregoing embodiments. The specific structure of each part of the present invention may be varied in design in many ways. Although the resistor element 4 described above is in the form of a single strip extending in the first direction X1, the resistor element 4 may be formed as a plurality of strips extending in the first direction X1. Also, although dividing into individual pieces is performed by dicing in the foregoing embodiment as illustrated in FIG. 12, a break groove may be formed in advance in the base 1 and dividing may be performed by breaking the base along the groove.

REFERENCE SIGNS 800 electronic device
803 filled-resin board
804 first conductive layer
805 second conductive layer
806, 807, 808 core member
809 first via
810 second via
100, 101, 200, 201 chip resistor
1 base
11 principal surface
12 reverse surface
13 first side surface
14 second side surface
15 third side surface
16 fourth side surface
2 first electrode portion
21 first principal surface electrode
22 first side surface electrode
23 first reverse surface electrode
25 first auxiliary electrode
251 first auxiliary electrode obverse surface
259 portion
27 first plating electrode
271 first principal surface layer
272 first side surface layer
273 first reverse surface layer
276 first layer
277 second layer
3 second electrode portion
31 second principal surface electrode
32 second side surface electrode
33 second reverse surface electrode
35 second auxiliary electrode
351 second auxiliary electrode obverse surface
359 portion
37 second plating electrode
371 second principal surface layer
372 second side surface layer
373 second reverse surface layer
376 first layer
377 second layer
4 resistor element
5 undercoat
6 overcoat
61 overcoat obverse surface
611 flat surface
612 first curved surface
613 second curved surface
79 trimming groove
X1 first direction
X2 second direction
Y1 direction
Z1 direction
891 laser beam
893 electroconductive material
L21, L22, L31, L32 dimension

The invention claimed is:

1. A chip resistor comprising:
a base including a principal surface;
a first principal surface electrode formed on the principal surface;
a second principal surface electrode formed on the principal surface and spaced apart from the first principal surface electrode in a first direction;
a resistor element formed on the principal surface and held in contact with the first principal surface electrode and the second principal surface electrode;
an overcoat covering the resistor element, the first principal surface electrode and the second principal surface electrode;
a first auxiliary electrode covering the first principal surface electrode and the overcoat; and
a first plating electrode covering the first auxiliary electrode,
wherein the first auxiliary electrode includes a portion offset from the first principal surface electrode in the first direction,
the first auxiliary electrode has an auxiliary electrode end face that faces in the first direction, and an auxiliary electrode obverse surface spaced apart from the overcoat via the auxiliary electrode end face,
the first principal surface electrode has a first principal surface electrode end face that faces in the first direction and is covered by the resistor element, and
the auxiliary electrode obverse surface has a curved portion that overlaps with the first principal surface electrode end face as viewed in plan.

2. The chip resistor according to claim 1, wherein the first plating electrode includes a portion offset from the overcoat in a direction in which the principal surface faces.

3. The chip resistor according to claim 1, wherein the auxiliary electrode obverse surface is covered by the first plating electrode.

4. The chip resistor according to claim 1, further comprising: a second auxiliary electrode covering the second principal surface electrode and the overcoat; and a second plating electrode covering the second auxiliary electrode, wherein the second auxiliary electrode includes a portion offset from the second principal surface electrode in a second direction opposite to the first direction.

5. The chip resistor according to claim 4, further comprising a first reverse surface electrode and a second reverse surface electrode, wherein the base includes a reverse surface facing away from the principal surface, the first reverse surface electrode is formed on the reverse surface and covered by the first plating electrode, and the second reverse surface electrode is formed on the reverse surface and covered by the second plating electrode.

6. The chip resistor according to claim 5, wherein the first plating electrode includes a principal surface layer close to the principal surface, and the principal surface layer includes a portion offset from the first reverse surface electrode in the first direction.

7. The chip resistor according to claim 6, wherein the principal surface layer is 200-260 μm in dimension in the first direction.

8. The chip resistor according to claim 5, wherein the first plating electrode includes a reverse surface layer close to the reverse surface, and the reverse surface layer includes a portion offset from the first auxiliary electrode in the first direction.

9. The chip resistor according to claim 8, the reverse surface layer is 200-260 μm in dimension in the first direction.

10. The chip resistor according to claim 1, further comprising a side surface electrode, wherein the base includes a side surface facing in a second direction opposite to the first direction, the side surface electrode covers the side surface of the base, and the first plating electrode covers the side surface electrode.

11. The chip resistor according to claim 10, wherein the side surface electrode is formed by sputtering.

12. The chip resistor according to claim 1, wherein the first plating electrode is made of at least one of Cu, Au, Ni or Sn.

13. The chip resistor according to claim 1, wherein the first plating electrode includes a first layer and a second layer, and the first layer includes a portion disposed between the second layer and the first auxiliary electrode.

14. The chip resistor according to claim 13, wherein the first layer is made of Ni, and the second layer is made of at least one of Cu, Au or Sn.

15. The chip resistor according to claim 1, further comprising an undercoat disposed between the resistor element and the overcoat.

16. An electronic device comprising:
a chip resistor as set forth in claim 1;
an undercoat disposed between the resistor element and the overcoat; and
a filled-resin board surrounding the chip resistor.

17. The electronic device according to claim 16, further comprising a conductive layer, wherein wherein the filled-resin board is formed with a via, the conductive layer is formed on an inner surface defining the via, and the conductive layer is in direct contact with the first plating electrode.

18. The electronic device according to claim 17, wherein the conductive layer is in direct contact with a portion of the first plating electrode which is provided close to the principal surface of the base.

19. The electronic device according to claim 17, wherein the conductive layer is in direct contact with a portion of the first plating electrode which is provided close to a reverse surface of the base opposite to the principal surface.

20. The electronic device according to claim 17, wherein the conductive layer and the first plating electrode are made of Cu.

* * * * *